United States Patent [19]

Kerzman et al.

[11] Patent Number: 5,726,903
[45] Date of Patent: Mar. 10, 1998

[54] METHOD AND APPARATUS FOR RESOLVING CONFLICTS BETWEEN CELL SUBSTITUTION RECOMMENDATIONS PROVIDED BY A DRIVE STRENGTH ADJUST TOOL

[75] Inventors: Joseph P. Kerzman, New Brighton; Douglas A. Fuller, Eagan, both of Minn.

[73] Assignee: Unisys Corporation, Blue Bell, Pa.

[21] Appl. No.: 597,931

[22] Filed: Feb. 7, 1996

[51] Int. Cl.⁶ .................................................. G06F 17/50
[52] U.S. Cl. ........................................ 364/489; 364/488
[58] Field of Search .............................. 364/468.28, 488, 364/489, 490, 491, 578

[56] References Cited

U.S. PATENT DOCUMENTS

| | | |
|---|---|---|
| 5,050,091 | 9/1991 | Rubin .................... 364/488 |
| 5,111,413 | 5/1992 | Lazansky et al. ........ 364/578 |
| 5,311,442 | 5/1994 | Fukushima ............... 364/488 |
| 5,440,720 | 8/1995 | Baisuck et al. .......... 395/500 |
| 5,490,268 | 2/1996 | Matsunaga ............... 395/550 |
| 5,590,049 | 12/1996 | Arora ................... 364/489 |
| 5,598,344 | 1/1997 | Dangelo et al. .......... 364/489 |
| 5,619,418 | 4/1997 | Blaauw et al. ........... 364/489 |

OTHER PUBLICATIONS

Tufte, "CML III Bipolar Standard Cell Library", Proceedings of the 1988 Bipolar Circuits and Technology Meeting, Minneapolis, Minnesota, Sep., 1988, pp. 180–182.

*Primary Examiner*—Kevin J. Teska
*Assistant Examiner*—Leigh Marie Garbowski
*Attorney, Agent, or Firm*—Nawrocki, Rooney & Sivertson, P.A.

[57] ABSTRACT

A method and apparatus for efficiently identifying and resolving conflicts between conflicting cell substitution recommendations. Unlike the prior art, the present invention provides a resolving means within a data processing system to identify and resolve conflicting cell substitution recommendations. The resolving means may categorize the cell substitutions in accordance with a number of predetermined cell substitution types, wherein each of the cell substitution type may be assign a predetermined priority value. Thereafter, the resolving means may identify conflicting cell substitution recommendations, and resolve the conflicts in accordance with the predetermined priority scheme.

57 Claims, 14 Drawing Sheets

SYMBOL REPRESENTATION

| SUBSTITUTION TYPE | PRIORITY | DESCRIPTION |
| --- | --- | --- |
|  |  | RESERVED |
| OVERIDE(0-9) | 10-19 | OVERIDE LIST |
| ZSLVMIN(0-9) | 20-29 | ZERO PHASE MINIMUM CELL SUBSTITUTION |
| CHIPDSA(0-9) | 30-39 | CHIP MAXIMUM DRIVE STRENGTH ADJUST SUBSTITUTIONS |
| PPDSA(0-9) | 40-49 | PARALLEL PATH MAXIMUM TIMING DRIVE STRENGTH ADJUST SUBSTITUTIONS |
| BRDDSA(0-9) | 50-59 | BOARD MAXIMUM TIMING DRIVE STRENGTH ADJUST SUBSTITUTIONS |
| BPDSA(0-9) | 60-69 | BACKPANEL MAXIMUM TIMING DRIVE STRENGTH ADJUST SUBSTITUTIONS |
| PTMAXCAP(0-4) | 70-74 | PRIMETIME MAXIMUM CAPACITANCE VIOLATION SUBSTITUTIONS |
| PTMAXTRA(0-4) | 75-79 | PRIMETIME MAXIMUM TRANSITION TIME VIOLATION SUBSTITUTIONS |
| LSMXLEN(0-4) | 80-84 | LASER MAXIMUM LENGTH VIOLATION SUBSTITUTIONS |
| XTALK(0-4) | 85-89 | LASER CROSSTALK VIOLATION SUBSTITUTIONS |
| LSMXCAP(0-4) | 90-94 | LASER MAXIMUM CAPACITANCE VIOLATION SUBSTITUTIONS |
| OMSTMIN(0-3) | 95-98 | ONE PHASE MINIMUM CELL SUBSTITUTIONS |
| RESET(0) | 99 | HIGHEST PRIORITY ON LOGICAL CELL TYPE MISMATCHES - LOWEST PRIORITY ON LOGICALLY EQUIVALENT SUBSTITUTIONS |

FIG. 11

METHOD AND APPARATUS FOR RESOLVING CONFLICTS BETWEEN CELL SUBSTITUTION RECOMMENDATIONS PROVIDED BY A DRIVE STRENGTH ADJUST TOOL

CROSS REFERENCE TO CO-PENDING APPLICATIONS

The present application is related to U.S. patent application Ser. No. 08/598,506, filed Feb. 7, 1996, entitled Method and Apparatus for performing Drive Strength Adjust Optimization in a Circuit Design, U.S. patent application Ser. No. 08/597,847, filed Feb. 7, 1996, entitled Method and Apparatus for performing Timing Analysis on a Circuit Design, and U.S. patent application Ser. No. 08/789,029, filed Jan. 27, 1997, entitled Method and Apparatus for Using a Placement Tool to manipulate cell Substitution lists, which are all assigned to the assignee of the present invention and are all hereby incorporated by reference.

BACKGROUND OF THE INVENTION

1. Field of the Invention

The present invention generally relates to the optimization of circuit designs and more particularly relates to resolving conflicts between cell substitution recommendations provided by a drive strength adjust tool.

2. Description of the Prior Art

The advancement of integrated circuit, printed circuit board and other related technologies is advancing at a very rapid rate. The latest generation of integrated circuits can incorporate over four times the circuitry than was possible just a few years ago. Further, circuit board and multi-chip module technology has allowed much denser circuit board designs. These and other developments have allowed the development of increasingly complex and high speed computer systems.

The design of such computer systems has become increasingly difficult and time consuming. To maximize performance and minimize the size and power of such computer system, designers often implement much of the hardware in a number of integrated circuits. For maximum performance, the integrated circuits are often custom or semi-custom designed. Each integrated circuit may contain several hundred thousand gates, and each gate must be placed and routed in accordance with the overall computer system specification, all on a die typically measuring less than 625 mils on a side.

To design such a computer system, the designer typically produces an overall system specification. The overall system specification typically defines the overall function of the computer system, including the power and timing requirements thereof. Because of the size and complexity of such computer systems, system designers often partition the overall design into a number of blocks, wherein each of the blocks performs a dedicated function. Partitioning is typically continued until the size of each of the sub-blocks is of a manageable size. A specification for each of the sub-blocks is then written to define the function, timing and power requirements thereof. Often, one or more of the sub-blocks are implemented in an integrated circuit.

After the sub-block specifications have been defined, logic designers typically enter a schematic into a design database for each sub-block, using selected components from a component library. The schematic is typically entered via a database editor on an engineering workstation, and the design database is typically stored therein.

The component library may include a number of cells wherein each of the cells implements a different function. For example, the component library may include NAND gates, NOR gates, XOR gates, registers, latches, I/O cells, etc. Further, each of the individual cells may have a logically equivalent component with a different drive strength. The desirability of having different drive strength cells within the component library is discussed in more detail below.

In addition to the above, each of the cells typically have a number of "representations" stored in the component library. For example, a cell may have a "symbolic representation", a "schematic representation", and a "physical representation". When entering the schematic, the designer typically provide the "symbolic representation" directly on the schematic sheet via the database editor, and interconnects the symbols to achieve the desired function.

After the schematic has been entered into the design database, the schematic may be processed, or expanded, into a design netlist. The design netlist typically identifies each of the library cells that are used in the schematic, and further identifies the interconnections therebetween. The netlist is often written in an EDIF (Electronic Design Interface Format) format. The EDIF format is an industry wide standard, developed to allow the design netlist to be compatible with various software programs developed by different vendors.

An alternative approach for entering the design into a design database involves using sophisticated synthesis tools. The word "tool" as used herein refers to a software program running on a data processing system. In such an approach, the designer enters logical equations describing the function of the design. A first synthesis tool implements the logical equations using logical cells from the component library. A second synthesis tool may then minimizes the logic using known techniques, and may attempt to optimize the design based on a number of predetermined factors. For example, the designer may direct the synthesis tool to optimize the design for speed, power, or some other factor.

Typically, the resulting design netlist is provided to a place and route tool. There are a number of place and route tools available on the market today. The place and route tool may read the "physical representation" of each cell within the design and place the physical representation within an imaginary two dimensional box. For integrated circuit designs, the imaginary box often corresponds to the outer periphery of the resulting integrated circuit die. Once all of the cells have been placed, the place and route tool interconnects the cells in accordance with the design netlist. Depending on the technology and the power bussing strategy of the component library, the place and route tool may provide the required interconnections (or routes) using up to five layers of metal.

Initially, the place and route tool may not take into account critical timing paths or other design parameters. However, as discussed below, most modern place and route tools have the capability of biasing the placement and routing of the cells to favor predetermined nets within the design database.

In some cases, it is advantageous to manually place certain critical cells within the design. The critical cells are often larger macrocells such as ALU's, RAMs, ROMs, or other macro blocks. The manual placement of these cells is typically accomplished via a floor-planning tool. Stand alone floor-planning tools are available. However, many place and route tools have at least a limited floor-planning capability. After the critical cells are manually placed by the designer, the remaining cells may be placed and the circuit design may be routed as described above.

The output of the place and route tools is typically a netlist in the EDIF format. In most large designs, the place and route netlist is hierarchical in nature. Thus, the place and route netlist typically only identifies the placement coordinates and orientation of each of the cells within the design, and does not contain the actual physical representation of each cell. Rather, the place and route netlist contains pointers to the physical representations stored in the component library. Thus, if a particular cell is used a number of times within the design, only one copy of the physical representation is required to be stored. The place and route netlist typically also identifies the interconnections, or routes, by the coordinates of the starting, ending, and any other points where the route changes direction. Further, the width of the route is also identified.

After the place and route netlist is generated, the designer may use an extraction tool to extract an RC file therefrom. The extraction tool may process the place and route netlist and may determine the resistance, capacitance, or any other parameters selected by the designer, for each net in the design. For example, the extraction tool may determined the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file, which may be read by the extraction tool.

After the extraction tool provides an RC file for the design, the RC file and the original netlist may be provided to a timing analysis tool. The timing analysis tool processes the netlist and the RC file to determine the timing of predetermined circuit paths within the design. Part of the pre-processing performed by the timing analysis tool is to read the timing information from the component library for each of the cells used in the design. For example, the timing information stored in the component library may include parameters such as a base delay, and delay per unit of capacitance. The timing analysis tool may use the timing information, along with the RC file to determine the delay for each cell within the design. Thereafter, the timing analysis tool identifies predetermined timing paths within the design, and adds the delay for each of the cells to determine an overall path delay for each timing path. The timing analysis tool may then report all timing paths that have an overall path delay that falls outside of a predetermined timing specification.

Timing analysis tools typically use a path enumeration algorithm or a critical path algorithm. The path enumeration algorithm identifies all timing paths within the design, and calculates the overall delay therefor. Thus, the path enumeration algorithm calculates the overall delay for timing paths that are well within the timing specification. In contrast, the critical path algorithm only identifies the worst case paths between registers, and calculates the overall delay therefor. The advantage of the path enumeration algorithm is that all timing paths that fall outside of the predetermined specification can be identified in a single run. However, for large designs, this may require a prohibitively long run time. The advantage of the critical path algorithm is that the run times may be relatively short, but more iterations may be required to identify all of the timing paths the fall outside of the timing specification.

Regardless of which timing analysis algorithm is used, the timing analysis tool may determine if any timing violations exist. If no timing violations exist, the design is deemed to meet the predefined timing specification. If however, the timing analysis tool identifies timing violations, the designer must evaluate each timing violation, and provide corrections to the design database to overcome such timing violations. For large designs having many timing violations, this may be prohibitively time consuming.

An approach to aid the designer in evaluating and correcting the timing violations identified by the timing analysis tool is suggested in an article entitled "CML III Bipolar Standard Cell Library", by Brian N. Tufte (Proceedings of the 1988 Bipolar Circuits Conference, Minneapolis, Minn., 1988). Tufte suggests using a software tool called SPEN (Speed Power Enhancement Program) to identify cells within the design that could be replaced by a higher power cell to reduce the delay of the corresponding timing path.

After appropriate cells have been identified for substitution, the designer must evaluate each cell substitution and determined if any conflicting cell substitutions have been recommended. For example, a conflict may arise when a particular cell resides in more than one timing path. That is, a particular cell may reside in a first timing path and may be recommended for substitution with a logically equivalent cell having a first drive strength. The same cell may further reside in a second timing path and may be recommended for substitution with a logically equivalent cell having a second drive strength. This is an example of a conflicting cell substitution recommendation that may routinely occur within a complex circuit design. It is contemplated, however, that many other types of conflicting cell substitutions may also arise.

After the designer identifies all conflicting cell substitution recommendations, the designer must resolve the conflicts. This may be difficult and time consuming, particularly in view of the increasing complexity of modern circuit designs. After the designer resolves all of the conflicting cell substitutions, the designer may then make the desired changes to the original design database. This may be accomplished by manually manipulating the design database using a database editor, or by manually creating a script to direct the database editor to make such changes. Alternatively, and depending on the how the database was originally entered, the designer may manually modify the synthesized database by substituting the selected higher power cells therein.

In either case, the design database is either expanded or synthesized to provide an updated design netlist incorporating the substituted cells, which may be provided to the place and route tool. The updated design may then be placed and routed. The process of placing and routing the design, extracting an RC file, performing timing analysis, identifying cells for substitution, and updating the design database may be repeated until the design falls within the timing specification.

A limitation of the above referenced design process is that the designer must first evaluate each cell substitution recommendation, and determine if any conflicting cell substitutions exist. Then, the designer must resolve all conflicts, and must attempt to achieve an overall optimal solution. These tasks have proved to be difficult and time consuming.

Modern circuit designs have become increasingly complex, and the increased gate densities and stringent design requirements have resulted in design problems that are increasingly interrelated. Thus, a designer may correct a first problem, but at the same time, may cause an unforeseen second problem. Thus, it is readily apparent that having a designer identify and resolve conflicting cell substitutions may be very time consuming, and may require a substantial number of design iterations to arrive at an optimal solution.

SUMMARY OF THE INVENTION

The present invention overcomes many of the disadvantages of the prior art by providing a method and apparatus for efficiently identifying and resolving conflicts between conflicting cell substitution recommendations. Unlike the prior art, the present invention provides a resolving means within a data processing system to identify and resolve conflicting cell substitution recommendations. The resolving means may categorize the cell substitutions in accordance with a number of predetermined cell substitution types, wherein each of the cell substitution type may be assign a predetermined priority value. Thereafter, the resolving means may identify conflicting cell substitution recommendations, and resolve the conflicts in accordance with the predetermined priority scheme.

In an exemplary embodiment, a data processing system is provided for resolving conflicts between conflicting component substitution recommendations. It is contemplated that the conflicting component substitution recommendations may be provided by a drive strength adjust tool. The drive strength adjust tool may provide component cell substitution recommendations to mitigate either timing violations or physical violations, or both. One such drive strength adjust tool is disclosed in the above referenced U.S. patent application Ser. No. 08/598,506, which has been incorporated herein by reference.

The drive strength adjust tool may operate on a circuit design wherein the circuit design is represented in a circuit design database including a number of components selected from a component library. It is contemplated that selected components of the component library may have at least one corresponding logically equivalent component with a different drive strength.

The drive strength adjust tool may provide a first recommendation to substitute a first component within the circuit design database with a corresponding logically equivalent component having a first drive strength. Further, the drive strength adjust tool may providing a second recommendation for substituting the first component with a corresponding logically equivalent component having a second drive strength, thereby resulting in a conflicting cell substitution. In accordance with the present invention, it is contemplated that a resolving means may be provided for resolving the conflict, and a providing means for providing a resolved component substitution recommendation.

It is contemplated that the drive strength adjust tool may provide a first recommendation type that is associated with the first recommendation, and a second recommendation type that is associated with the second recommendation. Further, a first priority may be assigned to the first recommendation type and a second priority may be assigned to the second recommendation type. Consistent with this priority assignment, the resolving means may resolve the conflict by selecting the recommendation having an associated recommendation type with the highest priority.

The recommendations of the first recommendation type may be stored to a first substitution file within the data processing system, and the recommendations of the second recommendation type may be stored to a second substitution file within the data processing system. The resolving means may then include a means for merging the first substitution file with the second substitution file, and a means for providing a resulting accumulated cell substitution file. During the merging process, the merging means may provide only the recommendations having the recommendation type with the highest priority to the accumulated cell substitution file. It is contemplated that the accumulated cell substitution file may be formatted to be read by a number of tools including a circuit floor planning tool, a circuit place and route tool, an RC file generator tool, etc.

The first substitution file may include a number of entries corresponding to selected components in the circuit design database wherein each entry may be a recommendation of the first recommendation type. The second substitution file may include a number of entries corresponding to selected components in the circuit design database wherein each entry is a recommendation of the second recommendation type.

An appending means may be provided for appending a first priority value to each of the number of entries in the first substitution file thereby resulting in a first appended substitution file. The appending means may further append a second priority value to each of the number of entries in the second substitution file thereby resulting in a second appended substitution file. A concatenating means may then concatenate the first appended substitution file and the second appended substitution file, thereby resulting in a concatenated substitution file. A sorting means may then sort the number of entries in the concatenated substitution file, first by component and then by priority. The sorting means may provide a sorted substitution file.

A deleting means may then delete duplicate entries within the sorted substitution file. That is, the deleting means may delete all entries that correspond to a particular component from the sorted substitution file, except for the highest priority entry. The deleting means may then provide a resolved cell substitution file, with all conflicts resolved in accordance with the predefined priority scheme.

It is contemplated that the data processing system may further include a substituting means coupled to the providing means for substituting the first component in accordance with the resolved cell substitution recommendation. Alternatively, it is contemplated that a designer may substitute the first component in accordance with the resolved component substitution recommendation, via a database editor or the like.

In another exemplary embodiment of the present invention, a first drive strength adjust tool may provide a first recommendation having the first recommendation type, and a second drive strength adjust tool may provide a second recommendation having the second recommendation type.

The first drive strength adjust tool may detect physical violations within the circuit design database, and may provide a first recommendation to substitute the first component with the corresponding logically equivalent component having the first drive strength to mitigate the physical violation. It is contemplated that the first drive strength adjust tool may detect various types of physical violations including, for example, maximum line length violations, maximum crosstalk violations, maximum capacitance violations, etc.

The second drive strength adjust tool may detect timing violations within the circuit design database, and may provide a second recommendation to substitute the first component with the corresponding logically equivalent component having the second drive strength to mitigate the thing violation. It is contemplated that the second drive strength adjust tool may detect various types of timing violations including, for example, setup violations, hold violations, minimum rise time violations, minimum fall time violations, etc.

In addition to the above, an exemplary method for resolving conflicting cell substitution recommendations is contemplated. The exemplary method may include the steps of: incorporating a number of component substitution recommendations into a number of cell substitution lists wherein each of the number of cell substitution lists include selected component substitution recommendations that correspond to a particular violation type; assigning a priority to each of the number of cell substitution lists; concatenating the number of cell substitution lists, thereby resulting in a concatenated cell substitution list; sorting the concatenated cell substitution list, thereby resulting in a sorted cell substitution list; and deleting duplicate entries from the sorted cell substitution list, except for the highest priority component substitution recommendation. It is contemplated that the assigning step may further include appending the priority assigned to each of the number of cell substitution lists to each component substitution recommendation included in the corresponding cell substitution list. It is further contemplated that the sorting step may sort the concatenated cell substitution list first by component and then by priority.

BRIEF DESCRIPTION OF THE DRAWINGS

Other objects of the present invention and many of the attendant advantages of the present invention will be readily appreciated as the see becomes better understood by reference to the following detailed description when considered in connection with the accompanying drawings, in which like reference numerals designate like parts throughout the figures thereof and wherein:

FIG. 11 is a table showing the number of cell substitution files of FIG. 10, and the priority assigned thereto;

DETAILED DESCRIPTION OF THE PREFERRED EMBODIMENTS

Figure 1:
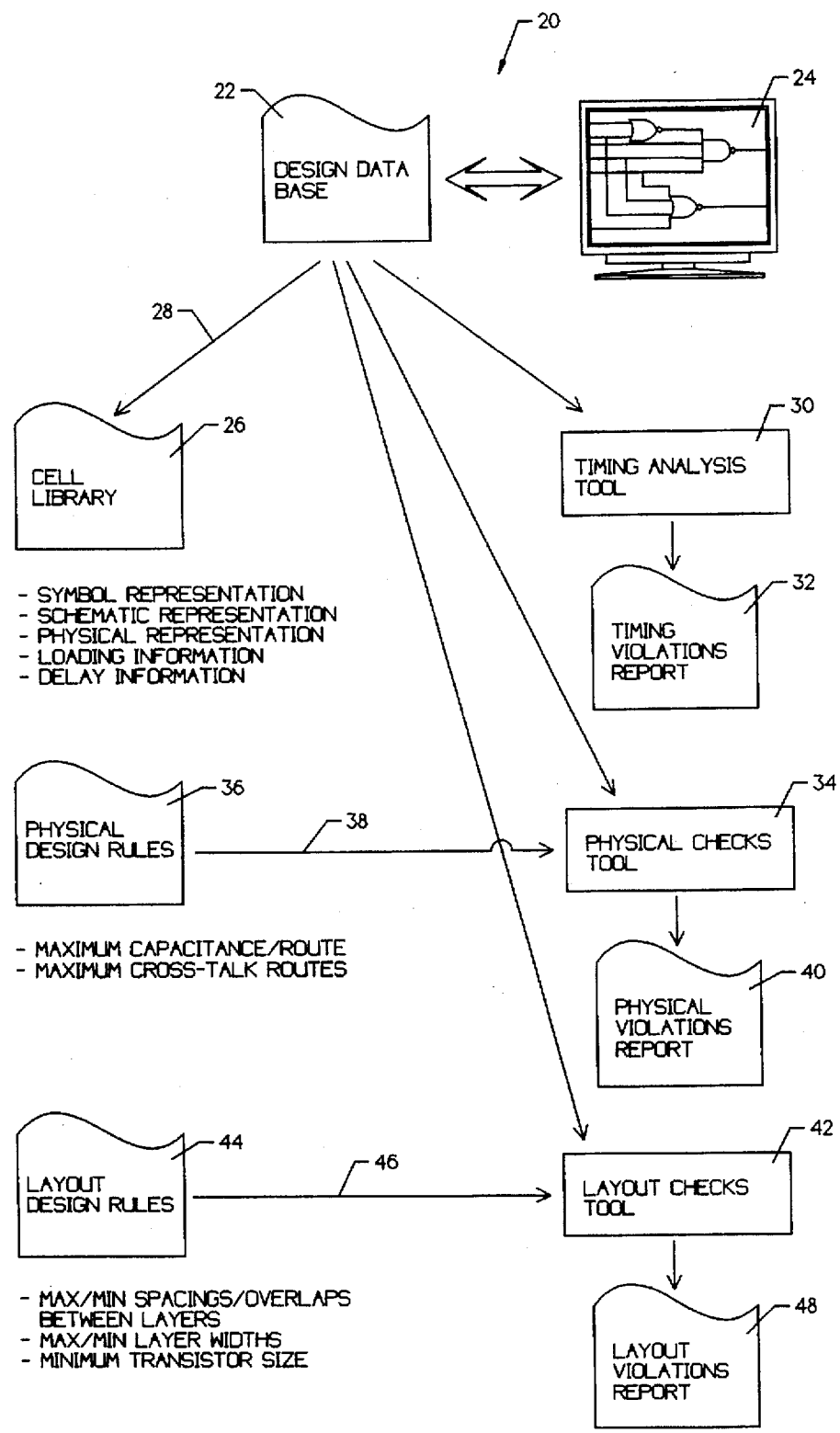
FIG. 1 is a block diagram showing a design database, a cell library and various software tools used to verify the design database.

FIG. 1 is a block diagram showing a design database, a component library and various software tools used to verify that the design database meets predefined specifications. The diagram is generally shown at 20. A typical design data base is shown at 22.

Initially, a functional description of the desired circuit is input into the design database 22. This may be accomplished in a number of ways, but typically logic designers enter a schematic using selected components from a component library 26. The schematic is typically entered via a database editor on an engineering workstation as shown at 24.

The component library 26 may include a number of cells wherein each of the cells implements a different function. For example, the component library may include NAND gates, NOR gates, XOR gates, registers, latches, I/O cells, etc. Further, each of the individual cells may have a logically equivalent component with a different drive strength (see FIG. 2). The desirability of having different drive strength cells within the component library is discussed in more detail below.

In addition to the above, each of the cells typically have a number of "representations" stored in the component library 26. For example, a cell may have a "symbolic representation", a "schematic representation", and a "physical representation". When entering the schematic, the designer typically provide the "symbolic representation" directly on the schematic sheet via the database editor as shown at 24, and interconnects the symbols to achieve the desired function.

After the schematic has been entered into the design database 22, the schematic may be processed, or expanded, into a design netlist. The design netlist typically identifies each of the library cells that are used in the schematic, and further identifies the interconnections therebetween. The netlist is often written in an EDIF (Electronic Design Interface Format) format. The EDIF format is an industry wide standard, developed to allow the design netlist to be compatible with various software programs developed by different vendors.

An alternative approach to entering the design into the design database 22 involves using sophisticated synthesis tools (not shown). In such an approach, the designer enters logical equations describing the function of the design. A first synthesis tool implements the logical equations using logical cells from the component library 26. A second synthesis tool may then minimizes the logic using known techniques, and may attempt to optimize the design based on a number of predetermined factors. For example, the designer may direct the synthesis tool to optimize the design for speed, power, or some other factor.

Typically, the resulting design netlist is provided to a place and route tool (not shown). There are a number of place and route tools available on the market today. The place and route tool may read the "physical representation" of each cell within the design and place the physical representation within an imaginary two dimensional box. For integrated circuit designs, the imaginary box often corresponds to the outer periphery of the resulting integrated circuit die. Once all of the cells have been placed, the place and route tool interconnects the cells in accordance with the design netlist. Depending on the technology and the power bussing strategy of the component library, the place and route tool may provide the required interconnections (or routes) using up to five layers of metal.

The output of the place and route tool is stored in the design database 22. In most large designs, the place and route netlist is hierarchical in nature. Thus, the place and route netlist typically only identifies the placement coordinates and orientation of each of the cells within the design, and does not contain the actual physical representation of each cell. Rather, the place and route netlist contains pointers 28 to the physical representations stored in the component library 26. Thus, if a particular cell is used a number of times within the design, only one copy of the physical representation is required to be stored. The place and route netlist typically also identifies the interconnections, or routes, by the coordinates of the starting, ending, and any other points where the route changes direction. Further, the width of the route is also identified.

After the place and route netlist is generated, the designer may use an extraction tool (not shown) to extract an RC file therefrom. The extraction tool may process the place and route netlist and may determine the resistance, capacitance, or any other parameters selected by the designer, for each net in the design. For example, the extraction tool may determined the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file (not shown), which may be read by the extraction tool.

After the extraction tool provides an RC file for the design, the RC file and the original netlist may be provided to a timing analysis tool 30. The timing analysis tool 30 processes the netlist and the RC file to determine the timing of predetermined circuit paths within the design. Part of the pre-processing performed by the timing analysis tool 30 is to read the timing information from the component library 26 for each of the cells used in the design. For example, the timing information stored in the component library 26 may include parameters such as a base delay, and delay per unit of capacitance. The timing analysis tool 30 may use the timing information, along with the RC file to determine the delay for each cell within the design. Thereafter, the timing analysis tool 30 may identify predetermined timing paths within the design, and add the delay for each of the cells to determine an overall path delay for each timing path. The timing analysis tool 30 may then report all timing paths that have an overall path delay that falls outside of a predetermined timing specification, as shown at 32. The timing analysis tool 30 may also determine if setup and hold times are met.

If no timing violations exist, the design is deemed to meet the predefined timing specification. If, however, the timing analysis tool 30 identifies timing violations, the designer must evaluate each timing violation, and provide corrections to the design database 22 to overcome such timing violations.

The design database 22 may also be provided to a physical checks tool 34. The physical checks tool 34 may read predefined physical design rules 36. The physical design rules may include parameters such as maximum load/net, maximum cross-talk between nets, etc. The physical checks tool 34 may perform these physical checks on the design database 22, and may report any violations as shown at 40.

Finally, the design database 22 may be provided to a layout checks tool 42. The layout checks tool 42 may read predefined layout design rules. The layout design rules 44 may include parameters such as maximum and minimum spacings and overlaps between layers, maximum and minimum layer widths, etc. The layout design rules are dictated by the particular processing technology used, and may help ensure that the resulting design can be manufactured with acceptable yields. The layout checks tool 42 may report any violations as shown at 48.

Figure 2A:
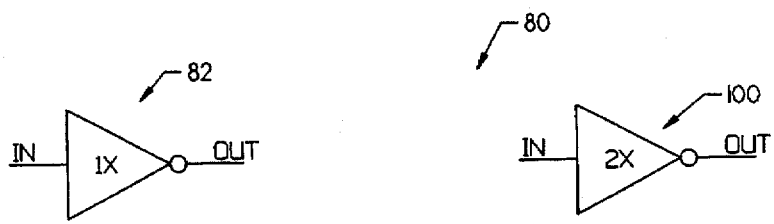
FIG. 2 is a block diagram showing typical cell representations for two logically equivalent cells having different drive strengths.
Figure 2B:
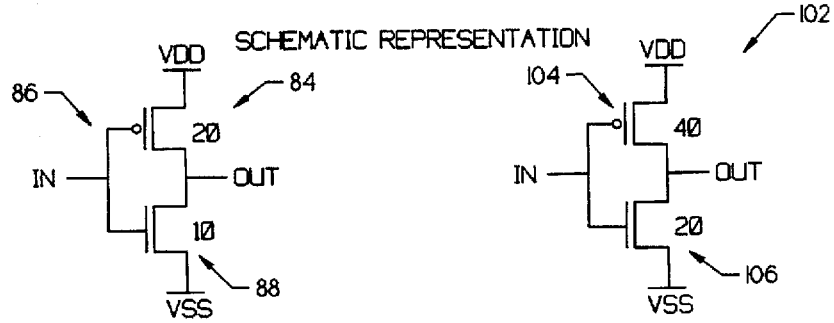
Figure 2C:
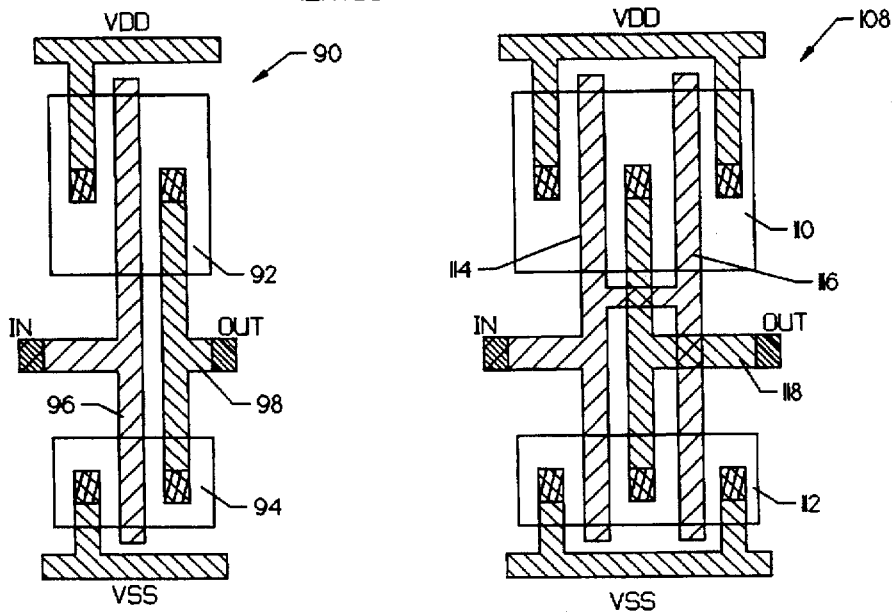

FIG. 2 is a block diagram showing typical cell representations for two logically equivalent cells having different drive strengths. The diagram is generally shown at 80. As indicated above, each of the cells in a component library 26 typically have a number of "representations" stored therein. For example, a cell may have a "symbolic representation", a "schematic representation", and a "physical representation". The symbolic representation is often used for schematic entry. The schematic representation is often used by circuit simulation programs such as SPICE, and a number of others tools. The physical representation is used by the extraction tool, the place and route tool, the physical checks tool 34, the layout checks tool, and a number of other tools.

Each of the individual cells may also have a logically equivalent component with a different drive strength. The desirability of having different drive strength cells within the component library is discussed in more detail below. FIG. 2 shows exemplary representations for a "1X" inverter and a "2X" inverter, wherein the "1X" and "2X" designations indicate the drive strength of the corresponding cell. For example, the "2X" inverter has twice the drive strength as the "1X" inverter.

The symbolic representation for the "1X" inverter is shown at 82, and the schematic representation for the "1X" inverter is shown at 84. The schematic representation 84 shows a P-Channel device 86 with a width of 20 and an N-Channel device 88 with a width of 10.

The physical representation of the "1X" inverter is generally shown at 90 and includes a number of mask layers that are used during the manufacturing of the component. For example, an N-Tub is shown at 92 and a P-Tub is shown at 94. The P-Channel transistor is created by a poly-silicon gate 96 overlapping the N-Tub 92 as shown. Similarly, the N-Channel transistor is created by the poly-silicon gate 96 overlapping the P-Tub 94 as shown.

The symbolic representation for the "2X" inverter is shown at 100, and the schematic representation for the "2X" inverter is shown at 102. The schematic representation 102 shows a P-Channel device 104 with a width of 40 and an N-Channel device 106 with a width of 20. Note that these widths are twice that of the "1X" inverter 84.

The physical representation of the "2X" inverter is generally shown at 108 and includes a number of mask layers that are used during the manufacturing of the component. For example, an N-Tub is shown at 110 and a P-Tub is shown at 112. The P-Channel device is created by poly-silicon gates 114 and 116 overlapping the N-Tub 110 as shown. Similarly, the N-Channel transistor is created by the polysilicon gates 114 and 116 overlapping the P-Tub 112 as shown. That is, the P-channel transistor 104 essentially includes two P-channel transistors connected in parallel, each having a width of 20. Similarly, the N-channel transistor 106 essentially includes two N-channel transistors in parallel, each having a width of 10.

Figure 3:
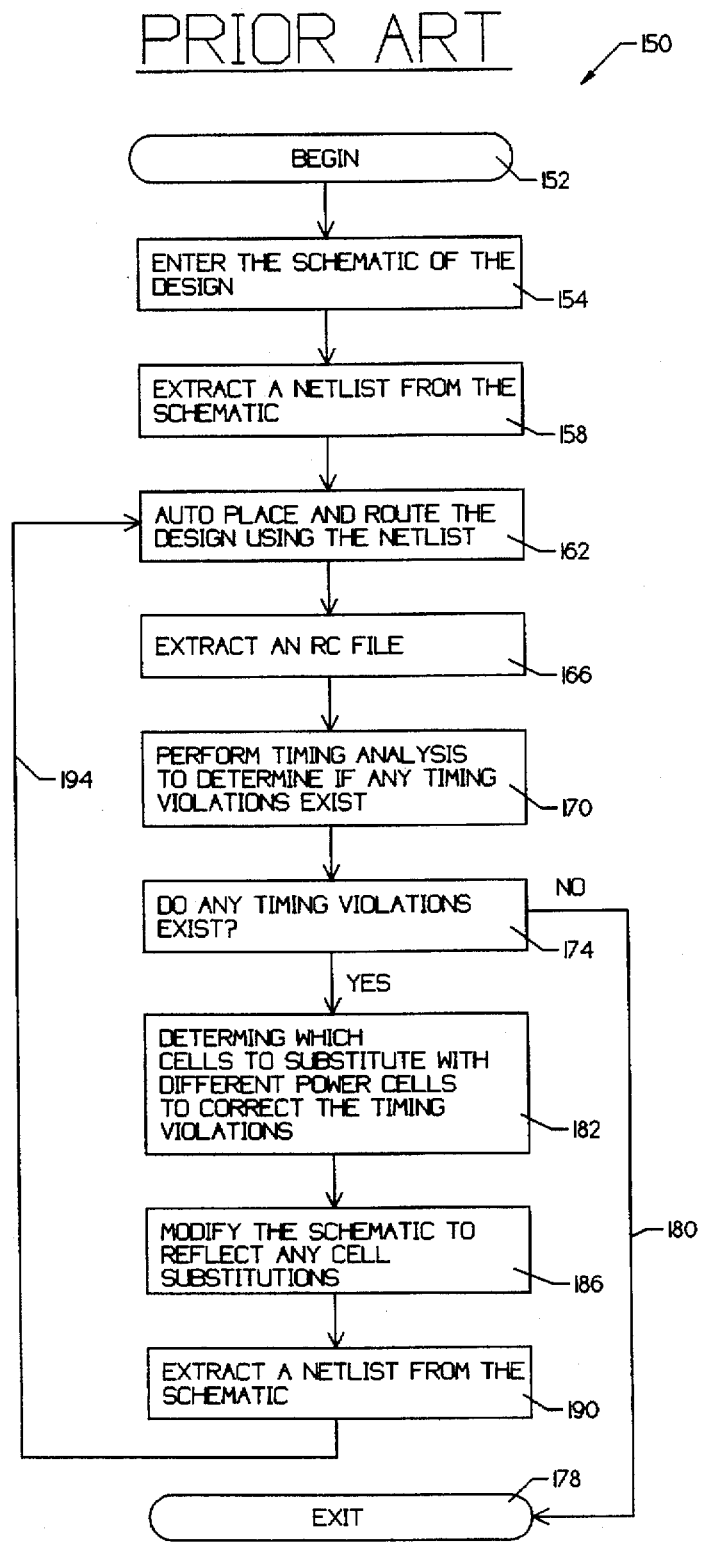
FIG. 3 is a flow diagram showing a prior art design method.

FIG. 3 is a flow diagram showing a prior art design method. The diagram is generally shown at 150. The method is entered at element 152. A logic designer may enter a schematic into a design database as shown at 154, using selected components from a component library. The schematic is typically entered via a database editor running on an engineering workstation, and the design database is typically stored therein.

After the schematic has been entered into the design database, the schematic may be processed, or expanded, into a design netlist as shown at 158. The design netlist typically identifies each of the library cells that are used in the schematic, and further identifies the interconnections therebetween. The netlist is often written in an EDIF (Electronic Design Interface Format) format. The EDIF format is an industry wide standard, developed to allow the design netlist to be compatible with various software tools developed by different vendors.

The resulting design netlist may then be provided to a place and route tool as shown at 162. There are a number of place and route tools available on the market today. The place and route tool may read the "physical representation" of each cell within the design and place the physical representation within an imaginary two dimensional box. For integrated circuit designs, the imaginary box often corresponds to the outer periphery of the resulting integrated circuit die. Once all of the cells have been placed, the place and route tool interconnects the cells in accordance with the design netlist. Depending on the technology and the power bussing strategy of the component library, the place and route tool may provide the required interconnections (or routes) using up to five layers of metal.

In most large designs, the place and route netlist is hierarchical in nature. Thus, the place and route netlist typically only identifies the placement coordinates and orientation of each of the cells within the design, and does not contain the actual physical representation of each cell. Rather, the place and route netlist contains pointers to the physical representations stored in the component library.

After the place and route netlist is generated, the designer may use an extraction tool to extract an RC file therefrom as shown at 166. The extraction tool may process the place and route netlist and may determine the resistance, capacitance, or any other parameters selected by the designer, for each net in the design. For example, the extraction tool may determined the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file, which may be read by the extraction tool.

After the extraction tool provides an RC file for the design, the RC file and the original design netlist may be provided to a timing analysis tool as shown at 170. The timing analysis tool processes the design netlist and the RC file to determine the timing of predetermined circuit paths within the design. Part of the pre-processing performed by the timing analysis tool is to read the timing information from the component library for each of the cells used in the design. For example, the timing information stored in the component library may include parameters such as a base delay, and delay per unit of capacitance. The timing analysis tool may use the timing information, along with the RC file to determine the delay for each cell within the design. Thereafter, the timing analysis tool identifies predetermined timing paths within the design, and adds the delay for each of the cells to determine an overall path delay for each timing path. The timing analysis tool may then report all timing paths that have an overall path delay that falls outside of a predetermined timing specification. That is, the timing analysis tool may determine if any timing violations exist.

If no timing violations exist, the design is deemed to meet the predefined timing specification and the method is exited as shown at 178 via interface 180. If however, the timing analysis tool identifies timing violations, the designer must evaluate each timing violation, and provide corrections to the design to overcome such timing violations.

An approach to aid the designer in evaluating and correcting the timing violations identified by the timing analysis tool is suggested in an article entitled "CML III Bipolar Standard Cell Library", by Brian N. Tufte (Proceedings of the 1988 Bipolar Circuits Conference, Minneapolis, Minn., 1988). Tufte suggests using a software tool called SPEN (Speed Power Enhancement Program) to identify cells within the design that could be replaced by a higher power cell to reduce the delay of the corresponding timing path.

After cells have been identified for substitution as shown at 182, the designer may make the desired changes to the original design database as shown at 186. This may be accomplished by manually manipulating the design database using a database editor, or by manually creating a script to direct the database editor to make such changes.

The design database is then expanded to provide an updated EDIF netlist incorporating the substituted cells as shown at 190, which may be provided to the place and route tool via interface 194. The updated design may then be placed and routed as shown at 162. The process of place and routing the design, extracting an RC file, performing thing analysis, identifying cells for substitution, updating the design database, and expanding the design database to provide an updated netlist may be repeated until the design falls within the design specification.

A limitation of the above referenced design process is that each iteration may take an unacceptable amount of time to complete. A substantial portion of the above referenced design cycle may be consumed by the expansion or synthesis of the design database, and the placing and routing the design. It would thus be advantageous to eliminate these steps from subsequent design iterations.

Figure 4:
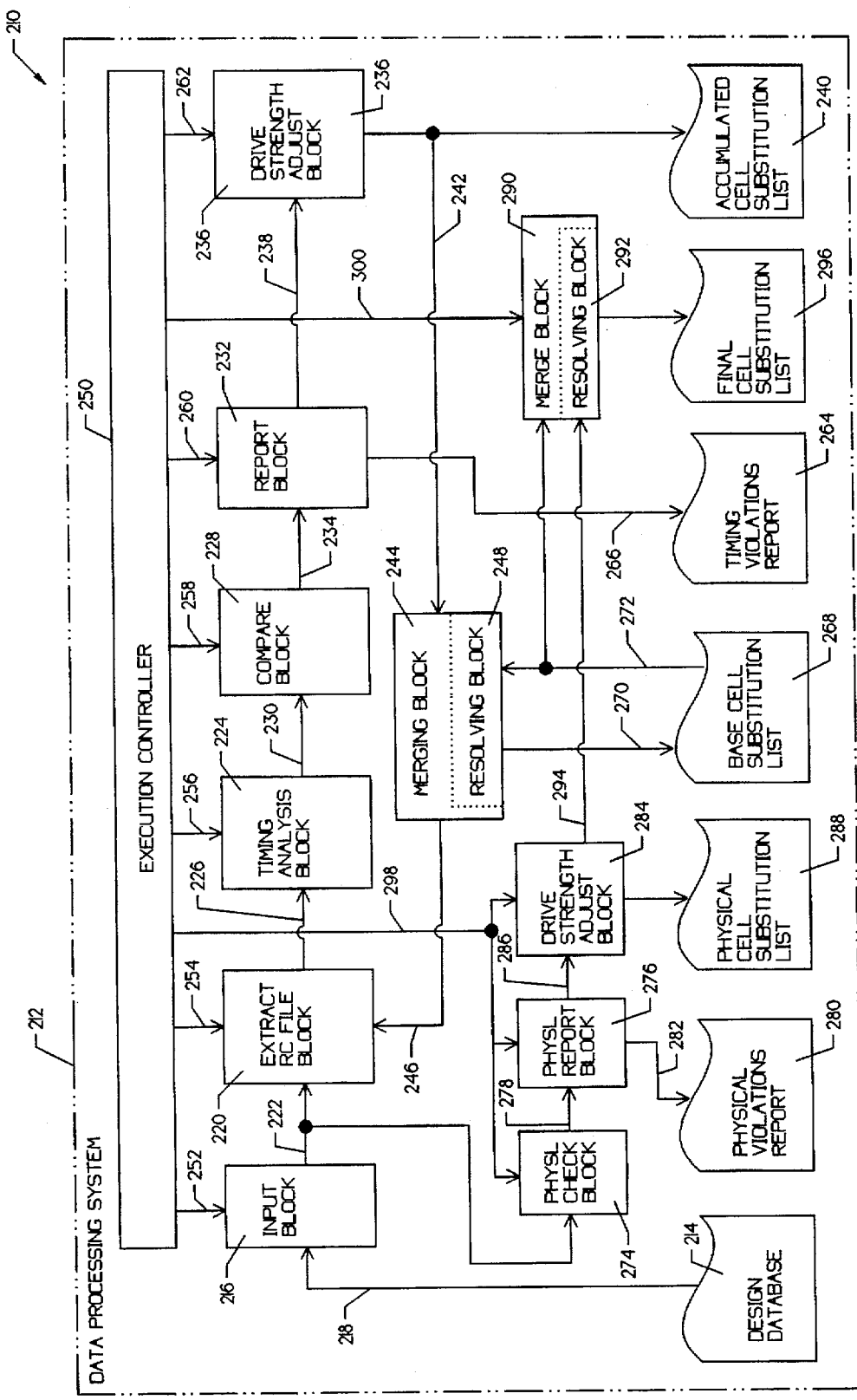
FIG. 4 is a block diagram showing a data processing system utilizing an exemplary embodiment of the present invention.

FIG. 4 is a block diagram showing a data processing system utilizing an exemplary embodiment of the present invention. The diagram is generally shown at 210, which includes a data processing system 212. The data processing system 212 includes a memory for storing a number of files, including design database 214. Further, the data processing system 212 includes an execution controller 250 for controlling the operation of data processing system 212.

A design database 214 is provided to a memory (not shown) located either internally or externally to data processing system 212. The memory may be a hard disk, RAM, ROM, magnetic tape or any other storage medium. It is contemplated that the design database 214 may include place and route data as described above. The design database 214 may be provided to input block 216 via interface 218. Input block 216 receives the design database 214 and provides the design database 214 to extract RC file block 220 via interface 222. Extract RC file block 220 extracts an RC file from the design database 214 as described above. Both the design database 214 and the RC file are provided to timing analysis block 224 via interface 226.

Timing Analysis block 224 analyzes a number of thing paths within the circuit design database 214. In the exemplary embodiment, the timing analysis block 224 calculates the delay of selected components along each of the timing paths and sums the delays of the selected components. To determine if any of the timing paths fall outside of a predefined specification, the exemplary embodiment may include a compare block 228 coupled to the timing analysis block 224 via interface 230, for comparing the delay along a selected timing path with a predefined specification.

The compare block 228 may provide the result of the compare to a report block 232 via interface 234. Report block 232 may write all timing violations to a timing violations file as shown at 264. Further, report block 232 may report all timing violations to a drive strength adjust block 236 via interface 238.

To mitigate any timing violations that may exist, drive strength adjust block 236 may determine a number of selected components along the timing paths identified by the report block 232 for substitution with a corresponding logically equivalent component having a different drive strength. The drive strength adjust block 236 may either increase or decrease the drive strength of selected cells, depending on the overall effect of the substitution on the performance of the timing path.

As indicated above, it is contemplated that the drive strength adjust block 236 may determine which of the cells within the design to substitute for a logically equivalent component having a different drive strength. In a preferred embodiment, this may be accomplished by identifying a number of timing paths wherein each of the timing path including a source latch, a destination latch, and a number of components connected therebetween. The drive strength adjust block 236 may identify the number of components that are in each of the number of timing paths, and the order thereof.

The drive strength adjust block 236 may then substitute a first one of the number of components with a corresponding logically equivalent component with a different drive strength, and may determine the delay of the timing path. Then, the drive strength adjust block 236 may substitute the first one of the number of components with a corresponding logically equivalent component having yet another drive strength, and may determine the delay of the timing path. The drive strength adjust block 236 may then determine which cell substitution provided the optimum delay. This process may be repeated until all logically equivalent components having different drive strengths are substituted for the first one of the number of components. The drive strength adjust block 236 may then select the logically equivalent component that produces the optimum delay for the timing path.

This process may be continued for each of the components along the corresponding timing path, thereby resulting in an overall optimum delay for the corresponding timing path. The drive strength adjust block 236 may output a list of the selected components and the suggested drive strength therefor.

It is contemplated that the cells to be substituted may be recorded in an accumulated cell substitution list 240 via interface 242 during each of the number of iteration. The accumulated cell substitution list 240 may then be merged with a base cell substitution list 268 by merging block 244. The accumulated cell substitution list 240 may be provided to the merging block 244 via interface 242, and the base cell substitution list 268 may be provided to the merging block 244 via interface 272. The merging block 244 may provide an updated base cell substitution list 268 via interface 270. The updated base cell substitution list 268 may be provided to the extract RC file block 220 via interface 246, wherein an updated RC file may be generated and provided to the timing analysis block 224 for the next design iteration.

Execution controller 250 may control input block 216, extract RC file block 220, timing analysis block 224, compare block 228, report block 232, and drive strength adjust block 236 via interfaces 252, 254, 256, 258, 260, and 262, respectively. Execution controller 250 controls the flow of the design database through the data processing system 212 such that said design database is processed by the extracting RC file block 220, timing analysis block 224, comparing block 228, report block 232, drive strength adjust block 236, and the merging block 244 for a predetermined number of iterations, or until the design meets the predefined specification.

It is contemplated that the merging block 244 may include a resolving block 248 for resolving any conflict between the accumulated cell substitution list 240 and the base cell substitution list 268. An example of when a conflict may arise is when a particular cell is identified in more than one timing path (see FIG. 5) during different design iterations. That is, the base cell substitution list 268 may identify a particular cell within a first timing path and may indicate that the particular cell is to be substituted with a logically equivalent cell having a first drive strength. The accumulated cell substitution list 240, and during the current design iteration, may also identify the same cell within a second timing path and may indicate that the particular cell is to be substituted with a logically equivalent cell having a second drive strength. It is contemplated that the resolving block 248 may resolve this and other conflicts. In a preferred embodiment, the conflict is resolved based upon a predetermined priority scheme. Further details of the preferred priority scheme may be found below.

In addition to the above, it is contemplated that the exemplary embodiment may perform physical checks of the circuit design and indicate any physical check violations therein. A physical checks block 274 may receive the design database 214 from the input block 216 via interface 222. The physical checks block 274 may process the design database 214 and determine if any physical checks violations are present. The physical checks block 274 may provide any physical checks violations to physical report block 276 via interface 278. Typical physical checks violations may include, for example, a capacitance on a route that exceeds a maximum capacitance value, cross-talk between two routes exceeds a maximum cross-talk value, etc. Physical report block 276 may write a physical violations report 280 to memory via interface 282. Further, physical report block 276 may report the physical violations to a second drive strength adjust block 284.

To mitigate any physical check violations, the second drive strength adjust block 284 may select cells to be substituted with corresponding logically equivalent components having a different drive strength. It is contemplated that the cells selected by the second drive strength adjust block 284 may be recorded in a physical cell substitution list 288. Physical checks block 274, physical report block 276, and the second drive strength adjust block 284 may be controlled by execution controller 250 via interface 298.

After the execution controller 250 executes the extracting RC file block 220, timing analysis block 224, comparing block 228, report block 232, drive strength adjust block 236, and the merging block 244 for a predetermined number of iterations, a second merging block 290 may merge the final base cell substitution list 268 with the physical cell substitution list 288. It is contemplated that the second merging block 290 may include a resolving block 292 to resolve any conflict between the final base cell substitution list 268 and the physical cell substitution list 288. Merging block 290 may be controlled by execution controller 250 via interface 300.

An example of when a conflict may arise in the second merging block 290 is when a particular cell is identified both by the drive strength adjust block 284 and the drive strength adjust block 236. That is, the final base cell substitution list 268 may indicate that a particular cell is to be substituted with a logically equivalent cell having a first drive strength to correct a timing violation. The drive strength adjust block 284 may also identify the same cell and may indicate that the particular cell is to be substituted with a logically equivalent cell having a second drive strength to correct a physical checks violation. It is contemplated that the resolving block 292 may resolve these and other conflicts. In a preferred embodiment, the conflict is resolved using a predetermined priority scheme. Further details of the preferred priority scheme may be found below.

After all conflicts are resolved, the second merging block 290 may provide a final cell substitution list 296. In a preferred embodiment, the final cell substitution list 296 is provided to a manual placement tool, or floor-planning tool (not shown). The manual placement tool may have an interface for reading the final substitution list and make the substitutions indicated therein to the design database. A further description of the interface for importing the final cell substitution list into the manual placement tool can be found in the above referenced U.S. patent application Ser. No. 08/789,029, which has been incorporated herein by reference.

The output of the manual placement tool may then be provided to the place and route tool for final placement and routing. It is recommended that the resulting design database be run through the thing analysis tool and the physical checks tool to verify that the final design meets the predetermined specification.

Finally, it is contemplated that the drive strength adjust blocks 236 and 284 may be used to reduce the power consumption of a circuit design. For example, the drive strength adjust block 236 may identify particular timing paths within the design that have excess margin with respect to the thing specification. Under such circumstances, the drive strength adjust block 236 may substitute selected components along these timing paths with a corresponding logically equivalent component having a lower drive strength to reduce the power consumption of the circuit design.

Figure 5:
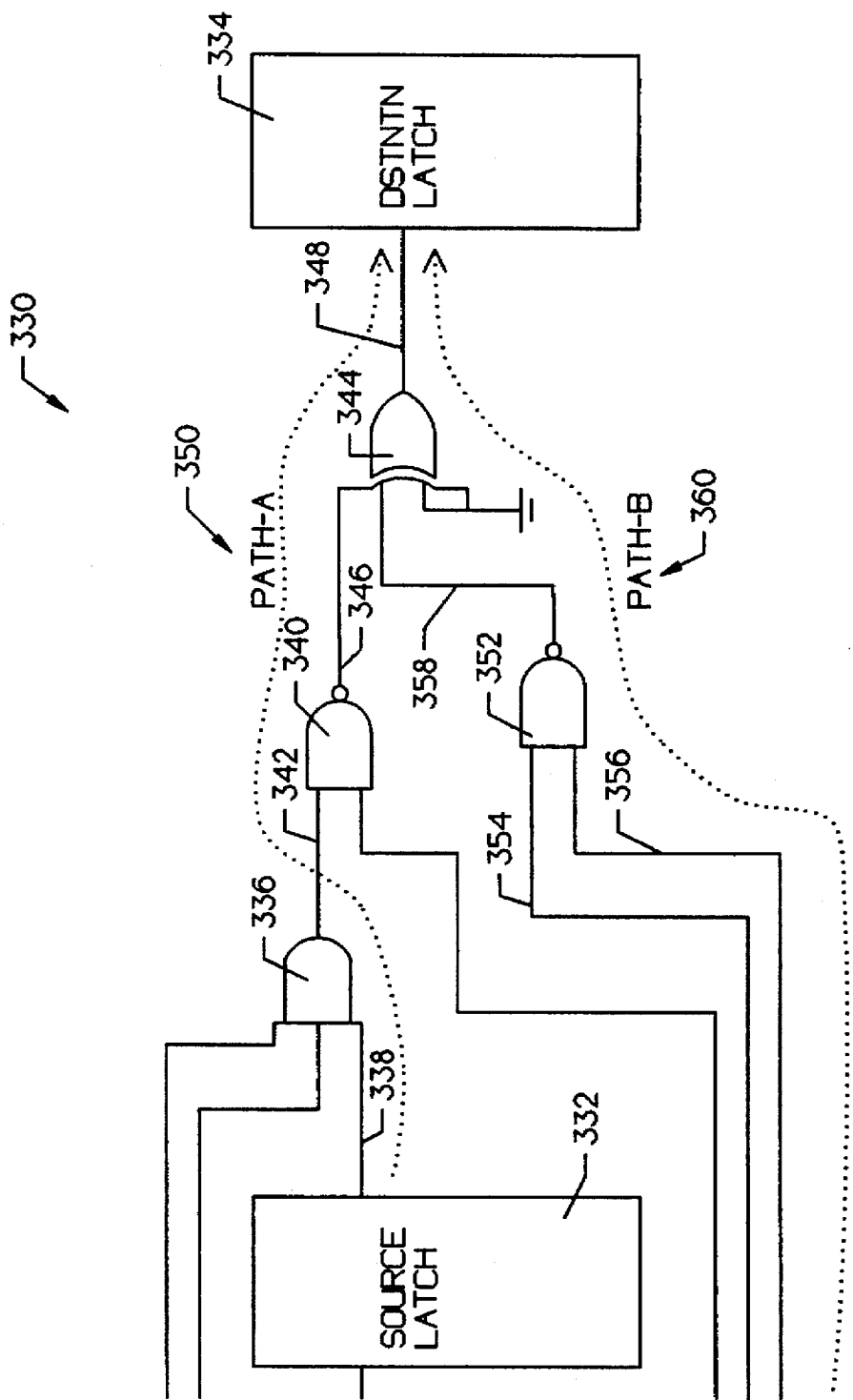
FIG. 5 is a schematic diagram showing two intersecting timing paths within a circuit design.

FIG. 5 is a schematic diagram showing two intersecting timing paths within a circuit design. The diagram is generally shown at 330. As indicated above, it is contemplated that the drive strength adjust block 236 (see FIG. 4) may determine which of the cells within the design to substitute for a logically equivalent component having a different drive strength. In a preferred embodiment, this may be accomplished by identifying a number of thing paths wherein each of the timing path including a source latch 332, a destination latch 334, and a number of components connected therebetween. In the illustrative circuit design, path-A 350 and path-B 360 are shown. Path-A 350 extends from source latch 332 to AND gate 336 via interface 338, from AND gate 336 to NAND gate 340 via interface 342, from NAND gate 340 to XOR gate 344 via interface 346, and finally to destination latch 334 via interface 348. Similarly, Path-B 360 extends from a source latch (not shown) to NAND gate 352 via interface 356, from NAND gate 352 to XOR gate 344 via interface 358, and finally to destination latch 334 via interface 348.

With respect to path-A 350, the drive strength adjust block 236 may substitute a first one of the number of components, for example component 336, with a corresponding logically equivalent component with a different drive strength, and may determine the delay of timing path-A 350. Then, the drive strength adjust block 236 may substituting the first one of the number of components 336 with a corresponding logically equivalent component having yet another drive strength, and may determine the delay of timing path-A 350. The drive strength adjust block 236 may then determine which cell substitution provided the optimum delay. This process may be repeated until all logically equivalent components having different drive strengths are substituted for the first one of the number of components 336. The drive strength adjust block 236 may then select the logically equivalent component that produces the optimum delay for timing path-A 350.

This process may be continued for each of the components along the corresponding timing path including gates 340 and 344, thereby resulting in an overall optimum delay for the corresponding timing path-A 350.

Similarly, and with respect to path-B 360, the drive strength adjust block 236 may substitute a first one of the number of components, for example component 352, with a corresponding logically equivalent component with a different drive strength, and may determine the delay of timing path-B 360. Then, the drive strength adjust block 236 may substituting the first one of the number of components 352 with a corresponding logically equivalent component having yet another drive strength, and may determine the delay of timing path-B 360. The drive strength adjust block 236 may then determine which cell substitution provided the optimum delay. This process may be repeated until all logically equivalent components having different drive strengths are substituted for the first one of the number of components 352. The drive strength adjust block 236 may then select the logically equivalent component that produces the optimum delay for timing path-B 360.

This process may be continued for each of the components along the corresponding timing path including gate 344,. thereby resulting in an overall optimum delay for the corresponding timing path-B 360.

In the present example, it is readily apparent that the drive strength adjust block 236 may produce a conflict with respect to XOR gate 344. That is, drive strength adjust block 236 may conclude that XOR gate 344 should be substituted with a logically equivalent gate having a first drive strength when analyzing timing path-A 350, and may conclude that XOR gate 344 should be substituted with a logically equivalent gate having a second drive strength when analyzing timing path-B 360. Thus, it is contemplated that drive strength adjust block 236 may itself have a resolving block (not shown) for resolving these conflicts. Further details of the preferred priority scheme may be found below. After the conflict is resolved, the drive strength adjust block 236 may output a list of the selected components and the suggested drive strength therefor.

Figure 6:
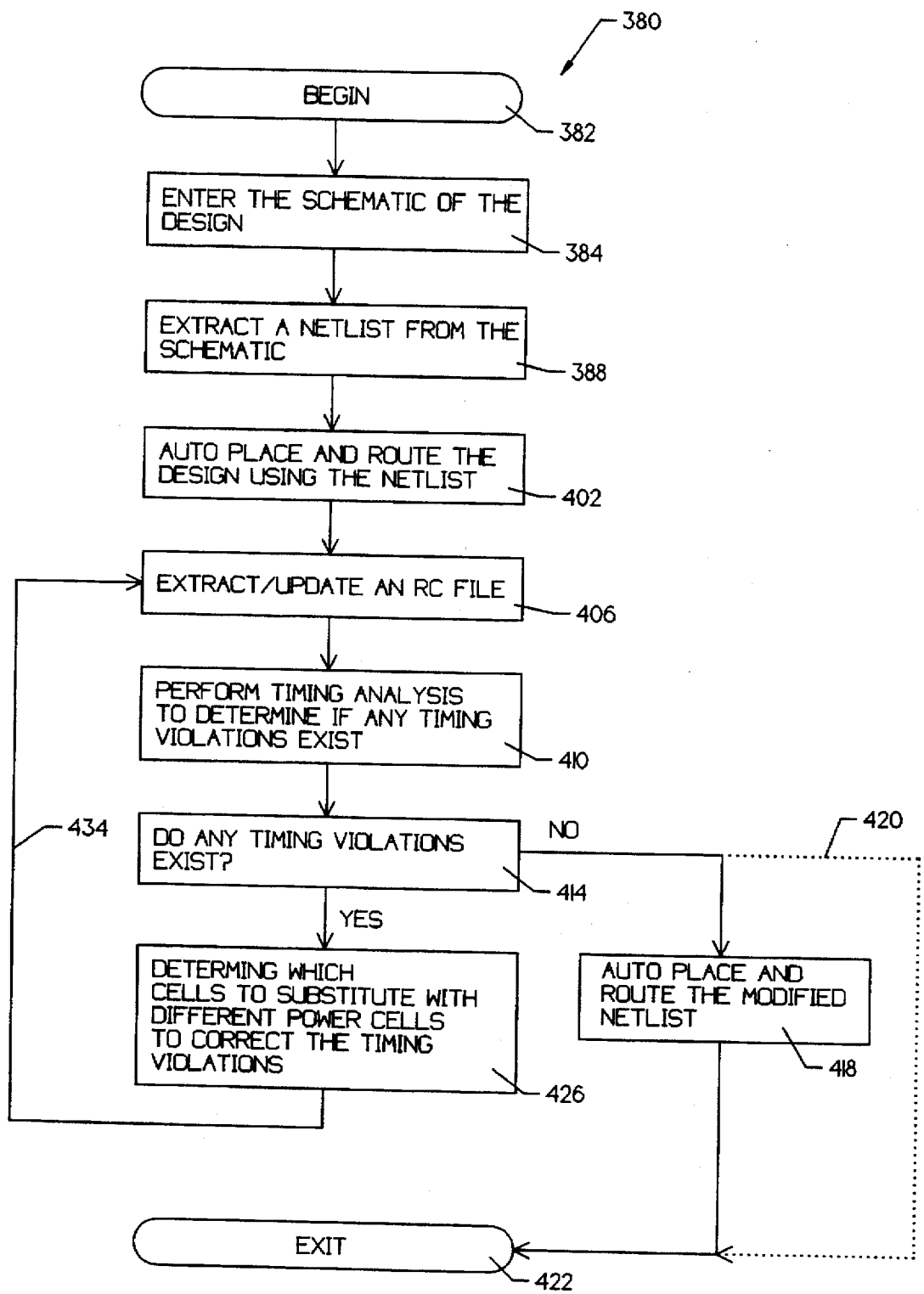
FIG. 6 is a flow diagram showing a first illustrative design method utilizing the present invention.

FIG. 6 is a flow diagram showing a first illustrative design method utilizing the present invention. The diagram is generally shown at 380. The method is entered at element 382. A logic designer typically enters a schematic into a design database as shown at 384, using selected components from a component library. The schematic is typically entered via a database editor running on an engineering workstation, and the design database is typically stored therein.

After the schematic has been entered into the design database, the schematic may be processed, or expanded, into a design netlist as shown at 388. The design netlist typically identifies each of the library cells that are used in the schematic, and further identifies the interconnections therebetween.

The resulting design netlist may then be provided to a place and route tool as shown at 402. The place and route tool may read the "physical representation" of each cell within the design, and place the physical representation within an imaginary two dimensional box. For integrated circuit designs, the imaginary box often corresponds to the outer periphery of the resulting integrated circuit die. Once all of the cells have been placed, the place and route tool interconnects the cells in accordance with the design netlist. Depending on the technology and the power bussing strategy of the component library, the place and route tool may provide the required interconnections (or routes) using up to five layers of metal.

After the place and route netlist is generated, the designer may use an extraction tool to extract an RC file therefrom as shown at 406. The extraction tool may process the place and route netlist and may determine the resistance, capacitance, or any other parameters selected by the designer, for each net in the design. For example, the extraction tool may determined the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file, which may be read by the extraction tool.

After the extraction tool provides an RC file for the design, the RC file and the original netlist may be provided to a timing analysis tool as shown at 410. The timing analysis tool processes the netlist and the RC file to determine the timing of predetermined circuit paths within the design. Part of the pre-processing performed by the timing analysis tool is to read the timing information from the component library for each of the cells used in the design. For example, the timing information stored in the component library may include parameters such as a base delay, and delay per unit of capacitance. The timing analysis tool may use the timing information, along with the RC file to determine the delay for each cell within the design. Thereafter, the timing analysis tool identifies predetermined timing paths within the design, and adds the delay for each of the cells to determine an overall path delay for each timing path. The timing analysis tool may then report all timing paths that have an overall path delay that falls outside of a predetermined timing specification. That is, the timing analysis tool may determine if any timing violations exist.

If no timing violations exist, the design is deemed to meet the predefined specification and the method is exited as shown at 422 via interface 420. That is, during the first design iteration, it is not necessary to auto place and route the design again because no modifications have been made to the design database. If, however, the timing analysis tool identifies timing violations, the designer must evaluate each timing violation, and provide corrections to the design database to overcome such timing violations.

To mitigate any timing violations that may exist, a drive strength adjust means 426 may be provided for substituting selected components along selected timing paths with a corresponding logically equivalent component having a different drive strength. The drive strength adjust means 426 is further described above with reference to FIGS. 4–5.

After cells have been identified for substitution as shown at 426, a cell substitution list is created and provided to the extraction tool 406 via interface 434. The extraction tool 406 may process the original place and route netlist and the cell substitution list and may determine the resistance, capacitance, or any other parameters selected by the designer, for each net in the design.

It is recognized that it is not necessary to repeat the place and route step 402 during each design iteration. That is, it is recognized that the placement and routing of the design does not significantly change, particularly when only cell substitutions are made to the design database. Further, it is recognized that the schematic need not be changed or expanded into a design netlist during each design iteration.

Rather, the extraction tool 406 may incorporate the cell substitution list provided by step 426 via interface 434, and may calculate an updated RC file based thereon. The updated RC file may then be used by the timing analysis tool 410 to determine if the updated design will meet the design specification. The process of extracting an RC file, performing timing analysis, and identifying cells for substitution may be repeated until the design falls within the design specification or until a predetermined number of design iterations have been achieved. After the design meets the design specification, a final place and route may be performed as shown at 418, and the method may be exited as shown at 422.

Figure 7:
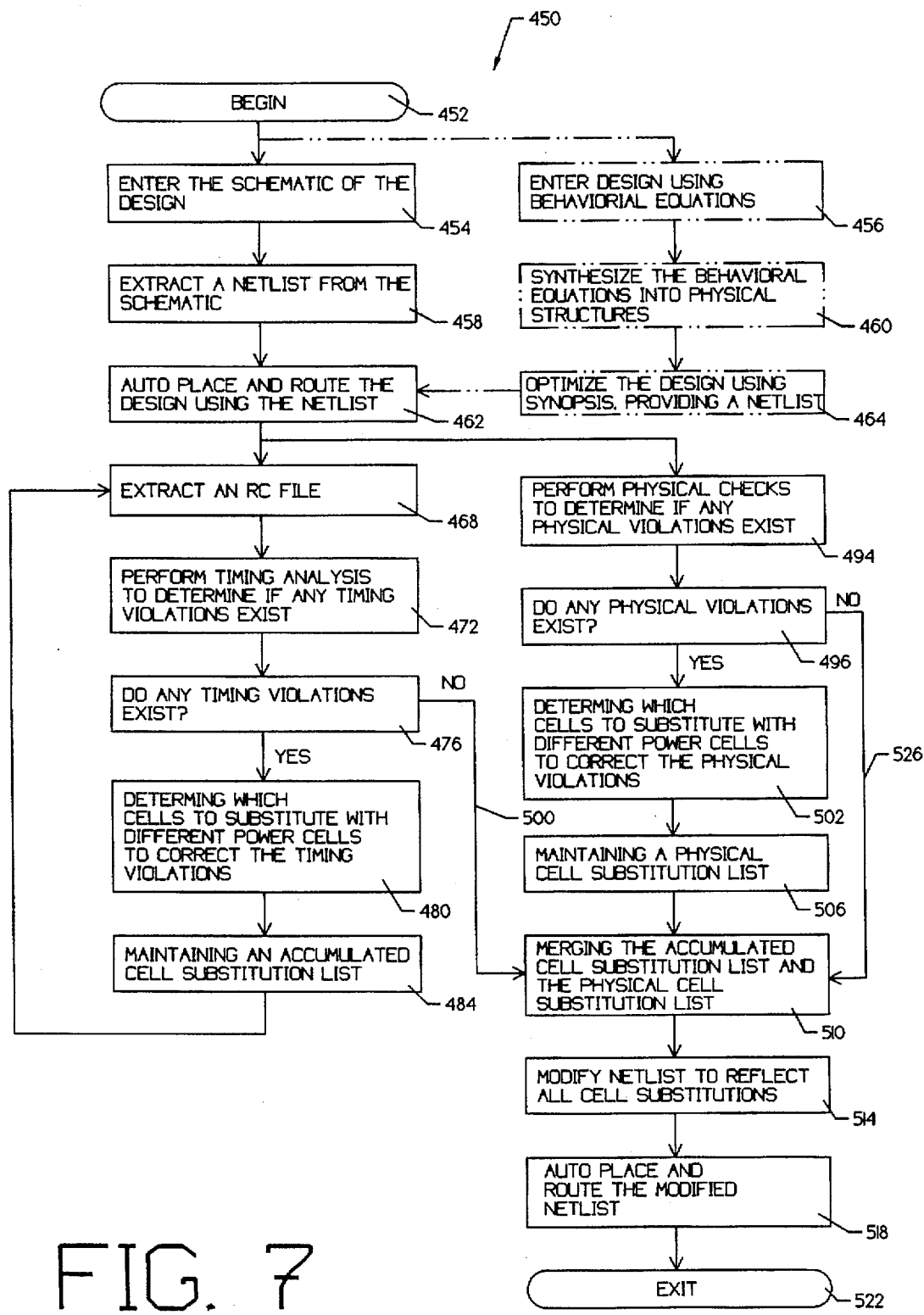
FIG. 7 is a flow diagram showing a second illustrative design method utilizing the present invention.

FIG. 7 is a flow diagram showing a second illustrative design method utilizing the present invention. The diagram is generally shown at 450. The method is entered at element 452. A logic designer typically enters a schematic into a design database as shown at 454, using selected components from a component library. The schematic is typically entered via a database editor running on an engineering workstation, and the design database is typically stored therein.

After the schematic has been entered into the design database, the schematic may be processed, or expanded, into a design netlist as shown at 458. The design netlist typically identifies each of the library cells that are used in the schematic, and further identifies the interconnections therebetween.

An alternative approach to entering the design into the design database involves using sophisticated synthesis tools. In such an approach, the designer enters logical equations describing the function of the design as shown at 456. A first synthesis tool 460 implements the logical equations using logical cells from the component library. A second synthesis tool 464 may then minimizes the logic using known techniques, and may attempt to optimize the design based on a number of predetermined factors. For example, the designer may direct the synthesis tool to optimize the design for speed, power, or some other factor.

The resulting design netlist may then be provided to a place and route tool as shown at 462. There are a number of place and route tools available on the market today. The place and route tool may read the "physical representation" of each cell within the design and place the physical representation within an imaginary two dimensional box. For integrated circuit designs, the imaginary box often corresponds to the outer periphery of the resulting integrated circuit die. Once all of the cells have been placed, the place and route tool interconnects the cells in accordance with the design netlist. Depending on the technology and the power bussing strategy of the component library, the place and route tool may provide the required interconnections (or routes) using up to five layers of metal.

In most large designs, the place and route netlist is hierarchical in nature. Thus, the place and route netlist typically only identifies the placement coordinates of each of the cells within the design, and does not contain the actual physical representation of each cell. Rather, the place and route netlist contains pointers to the physical representations stored in the component library. Thus, if a particular cell is used a number of times within the design, only one copy of the physical representation is required to be stored. The place and route netlist typically also identifies the interconnections, or routes, by the coordinates of the starting, ending, and any other points where the route changes direction. Further, the width of the route is also identified.

After the place and route netlist is generated, the designer may use an extraction tool to extract an RC file therefrom as shown at 468. The extraction tool may process the place and route netlist and may determine the resistance, capacitance, or any other parameters selected by the designer, for each net in the design. For example, the extraction tool may determined the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file, which may be read by the extraction tool.

After the extraction tool provides an RC file for the design, the RC file and the original netlist may be provided to a timing analysis tool as shown at 472. The timing analysis tool processes the netlist and the RC file to determine the timing of predetermined circuit paths within the design. Part of the pre-processing performed by the timing analysis tool is to read the timing information from the component library for each of the cells used in the design. For example, the timing information stored in the component library may include parameters such as a base delay, and delay per unit of capacitance. The timing analysis tool may use the timing information, along with the RC file to determine the delay for each cell within the design.

Thereafter, the timing analysis tool identifies predetermined timing paths within the design, and adds the delay for each of the cells to determine an overall path delay for each timing path. The timing analysis tool may then report all timing paths that have an overall path delay that falls outside of a predetermined timing specification. That is, the timing analysis tool may determine if any timing violations exist.

If no timing violations exist, the design is deemed to meet the predefined timing specification, and control is passed to step 510 via interface 500. If, however, the timing analysis tool identifies timing violations, the designer must evaluate each timing violation, and provide corrections to the design to overcome such timing violations.

To mitigate any timing violations that may exist, a drive strength adjust tool 480 may be provided for substituting selected components along selected thing paths with a corresponding logically equivalent component having a different drive strength. The drive strength adjust tool 480 is further described above with reference to FIGS. 4-5.

After cells have been identified for substitution by the drive strength adjust tool 480, an accumulated cell substitution list is created at shown at 484. The accumulated cell substitution list identifies the cells that are to be substituted for a given design iteration. The accumulated cell substitution list may be provided to the extraction tool 468 via interface 492. The extraction tool 468 may process the original place and route netlist and the accumulated cell substitution list and may determine the resistance, capacitance, or any other parameters selected by the designer, for each net in the design.

It is recognized that it is not necessary to repeat the place and route step 462 during each design iteration. That is, it is recognized that the placement and routing of the design does not significantly change, particularly when only cell substitutions are made to the design database. Further, it is recognized that the schematic or behavioral equations need not be updated during each design iteration. Thus, the schematic need not be expanded or the behavioral equations need not be synthesized during each of the subsequent design iterations. This may significantly reduce the design cycle time.

In the exemplary embodiment, the extraction tool 468 may incorporate the accumulated cell substitution list provided by step 484, and may calculate an updated RC file based thereon. The updated RC file may then be used by the timing analysis tool 472 to determine if the updated design will meet the design specification. The process of extracting an RC file, performing timing analysis, identifying cells for substitution, and creating an accumulated cell substitution list may be repeated until the design falls within the design specification, or until a predetermined number of design iterations has been reached.

In addition to the above, it is contemplated that the exemplary embodiment may perform physical checks on the circuit design as shown at 494. The physical checks step may indicate any physical check violations therein, as shown at 496. The physical checks step 494 may report a violation if, for example, the capacitance on a route exceeds a maximum capacitance value, the cross-talk between two routes exceeds a maximum cross-talk value, etc.

If no physical checks violations exist, control is passed to step 510 via interface 526. If, however, physical checks violations exist, a second drive strength adjust step 502 may be provided for selecting cells to be substituted with a corresponding logically equivalent component having a different drive strength to mitigate such physical check violations.

It is contemplated that the cells selected by the second drive strength adjust step 502 may be recorded in a physical checks substitution list, as shown at 506. After the above described timing violation design iterations are complete, and the design meets the predetermined timing specification, a merging step 510 may merge the accumulated cell substitution list with the physical checks substitution list. It is contemplated that the merging step 510 may resolve any conflict between the accumulated cell substitution list with the physical checks substitution list, as described above.

An example of when a conflict may arise during the merging step 510 is when a particular cell is identified both by the drive strength adjust step 502 and the drive strength adjust step 480. That is, the accumulated cell substitution list may indicate that a particular cell is to be substituted with a logically equivalent cell having a first drive strength to correct a timing violation. The drive strength adjust step 502 may also identify the same cell and may indicate that the particular cell is to be substituted with a logically equivalent cell having a second drive strength to correct a physical checks violation. It is contemplated that the present invention may resolve these and other conflicts. In a preferred embodiment, the conflict is resolved using a predetermined priority scheme. Further details of the preferred priority scheme may be found below.

After all conflicts are resolved, the merging step 510 may provide a final substitution list. In the exemplary embodiment, the final substitution list is used by the designer to modify the design database accordingly, as shown at 514. Thereafter, the modified design database is provided to the place and route tool as shown at 518, for final placement and routing. The exemplary method may then be exited as shown at 522.

Figure 8:
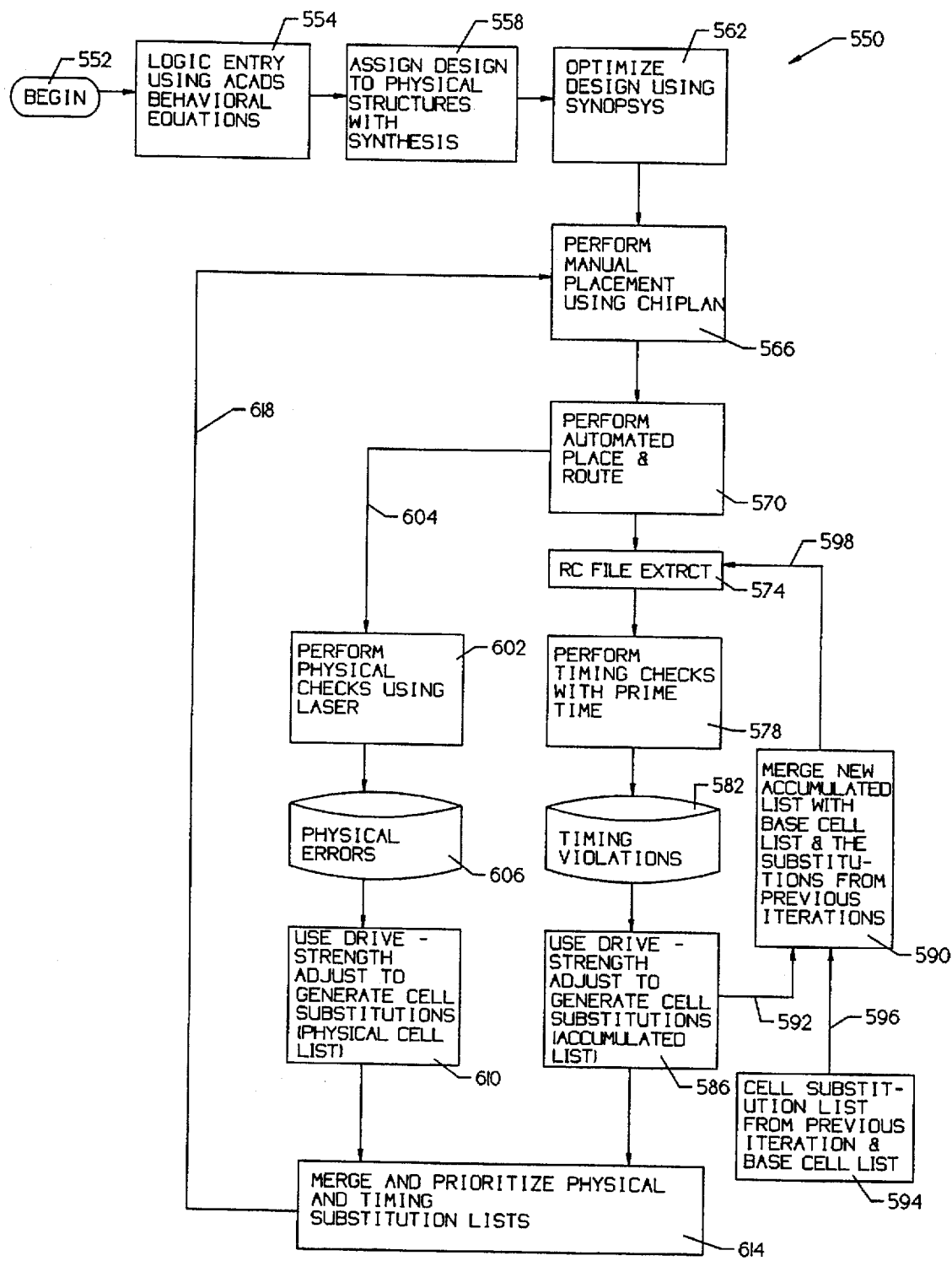
FIG. 8 is a flow diagram showing a third illustrative design method utilizing the present invention.

FIG. 8 is a flow diagram showing a third illustrative design method utilizing the present invention. The diagram is generally shown at 550. The method is entered at element 552. A logic designer typically enters logical equations describing the function of the design, as shown at 554. In the exemplary embodiment, a logic entry tool called ACADS is used. A first synthesis tool 558 may then implement the logical equations using logical cells from a component library. A second synthesis tool 562 may then minimize the logic using known techniques, and may attempt to optimize the design based on a number of predetermined factors. For example, the designer may direct the synthesis tool to optimize the design for speed, power, or some other factor. In the exemplary embodiment, a widely known synthesis tool called SYNOPSYS is used. The output of the second synthesis tool may be a design netlist, and preferably in the EDIF format.

The resulting design netlist may then be provided to a manual placement tool as shown at 566. In some cases, it is advantageous to manually place certain critical cells within the design. The critical cells are often larger macrocells such as ALU's, RAMs, ROMs, or other macro blocks. The manual placement of these cells is typically accomplished via a floor-planning tool. Stand alone floor-planning tools are available. However, many place and route tools have at least a limited floor-planning capability. After the critical cells are manually placed by the designer, the remaining cells may be automatically placed and routed by the place and route tool, as shown at 570.

After the place and route netlist is generated, the designer may use an extraction tool to extract an RC file therefrom as shown at 574. The extraction tool may process the place and route netlist and may determine the resistance, capacitance, or any other parameters selected by the designer, for each net in the design. For example, the extraction tool may determined the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file, which may be read by the extraction tool.

After the extraction tool provides an RC file for the design, the RC file and the original netlist may be provided to a timing analysis tool as shown at 578. The timing analysis tool processes the netlist and the RC file to determine the timing of predetermined circuit paths within the design. Part of the pre-processing performed by the timing analysis tool is to read the timing information from the component library for each of the cells used in the design. For example, the timing information stored in the component library may include parameters such as a base delay, and delay per unit of capacitance. The timing analysis tool may use the timing information, along with the RC file to determine the delay for each cell within the design. Thereafter, the timing analysis tool identifies predetermined timing paths within the design, and adds the delay for each of the cells to determine an overall path delay for each timing path. The timing analysis tool may then report all timing paths that have an overall path delay that falls outside of a predetermined timing specification. That is, the timing analysis tool may determine if any timing violations exist, and may store a record of the timing violations as shown at 582.

If the timing analysis tool identifies timing violations, the designer must evaluate each timing violation, and provide corrections to the design to overcome such timing violations. To mitigate any timing violations that may exist, a first drive strength adjust tool 586 may be provided to identify selected components along selected timing paths to substitute with a corresponding logically equivalent component having a different drive strength. The first drive strength adjust tool 586 is further described above with reference to FIGS. 4-5.

After selected cells have been identified for substitution by the first drive strength adjust tool 586, an accumulated cell substitution list is created. The accumulated cell substitution list identifies the cells that are to be substituted during the present design iteration. The accumulated cell substitution list may be provided to a first merging step 590 via interface 592. Further, a base cell substitution list is provided to the first merging step 590 via interface 596. In the exemplary embodiment, the base cell substitution list is updated each design iteration and thus contains a master list of all cell substitutions.

The first merging step 590 merges the accumulated cell substitution list with the base cell substitution list thereby resulting in an updated base cell substitution list.

It is contemplated that the first merging step 590 may resolve any conflict between the accumulated cell substitution list and the base cell substitution list. An example of when a conflict may arise is when a particular cell is identified in more than one timing path during different design iterations. That is, the base cell substitution list may identify a particular cell within a first timing path and may indicate that the particular cell is to be substituted with a logically equivalent cell having a first drive strength. The accumulated cell substitution list, and during the current design iteration, may also identify the same cell within a second timing path and may indicate that the particular cell is to be substituted with a logically equivalent cell having a second drive strength. It is contemplated that the first merging step 590 may resolve this and other conflicts. In a preferred embodiment, the conflict is resolved based upon a predetermined priority scheme. Further details of the preferred priority scheme may be found below.

The updated base cell substitution list may be provided to the extracting tool 574, wherein an updated RC file may be generated and provided to the timing analysis tool 578 for the next design iteration. The extraction tool 598 may process the original place and route netlist and the updated base cell substitution list and may determine the resistance, capacitance, or any other parameters selected by the designer, for each net in the design.

Unlike the prior art, it is recognized that it is not necessary to repeat the place and route step 570 during each design iteration. That is, it is recognized that the placement and routing of the design does not significantly change, particularly when only cell substitutions are made to the design database. Further, it is recognized that the behavioral equations need not be updated during each design iteration. Thus, the behavioral equations need not be synthesized during each of the subsequent design iterations. This may significantly reduce the design cycle time.

In the exemplary embodiment, the process of extracting an RC file, performing timing analysis, identifying cells for substitution, creating an accumulated cell substitution list, and merging the accumulated cell substitution list with the base cell substitution list may be repeated until the design falls within the design specification, or until a predetermined number of design iterations has been reached.

In addition to the above, it is contemplated that the exemplary embodiment may perform physical checks on the circuit design as shown at 602. The physical checks step 602 may indicate any physical check violations therein, and the physical check violations may be stored as shown at 606.

If physical checks violations are detected, a second drive strength adjust tool 610 may be provided for selecting cells for substitution with a corresponding logically equivalent component having a different drive strength to mitigate such physical check violations. It is contemplated that the cells selected by the second drive strength adjust step 610 may be recorded in a physical checks substitution list as shown at 610.

After the above described timing violation design iterations are complete, and the design meets the predetermined timing specification, a second merging step 614 may merge the accumulated cell substitution list with the physical checks substitution list. It is contemplated that the second merging step 614 may resolve any conflict between the accumulated cell substitution list and the physical checks substitution list, as described above.

An example of when a conflict may arise during the second merging step 614 is when a particular cell is identified both by the first drive strength adjust tool 586 and the second drive strength adjust tool 610. That is, the accumulated cell substitution list may indicate that a particular cell is to be substituted with a logically equivalent cell having a first drive strength to correct a timing violation. The second drive strength adjust tool 610 may also identify the same cell and may indicate that the particular cell is to be substituted with a logically equivalent cell having a second drive strength to correct a physical checks violation. It is contemplated that the present invention may resolve these and other conflicts. In a preferred embodiment, the conflict is resolved using a predetermined priority scheme. Further details of the preferred priority scheme may be found below.

After all conflicts are resolved, the second merging step 614 may provide a final substitution list. In the exemplary embodiment, the final substitution list is provided to the manual placement tool 566 via interface 618. The designer may then make the necessary modifications to the design database. Thereafter, the design database may be provided to the place and route tool, for final placement and routing. The exemplary method may then be exited (not shown), or the process may be repeated to verify that the design database meets the circuit design specification.

Figure 9:
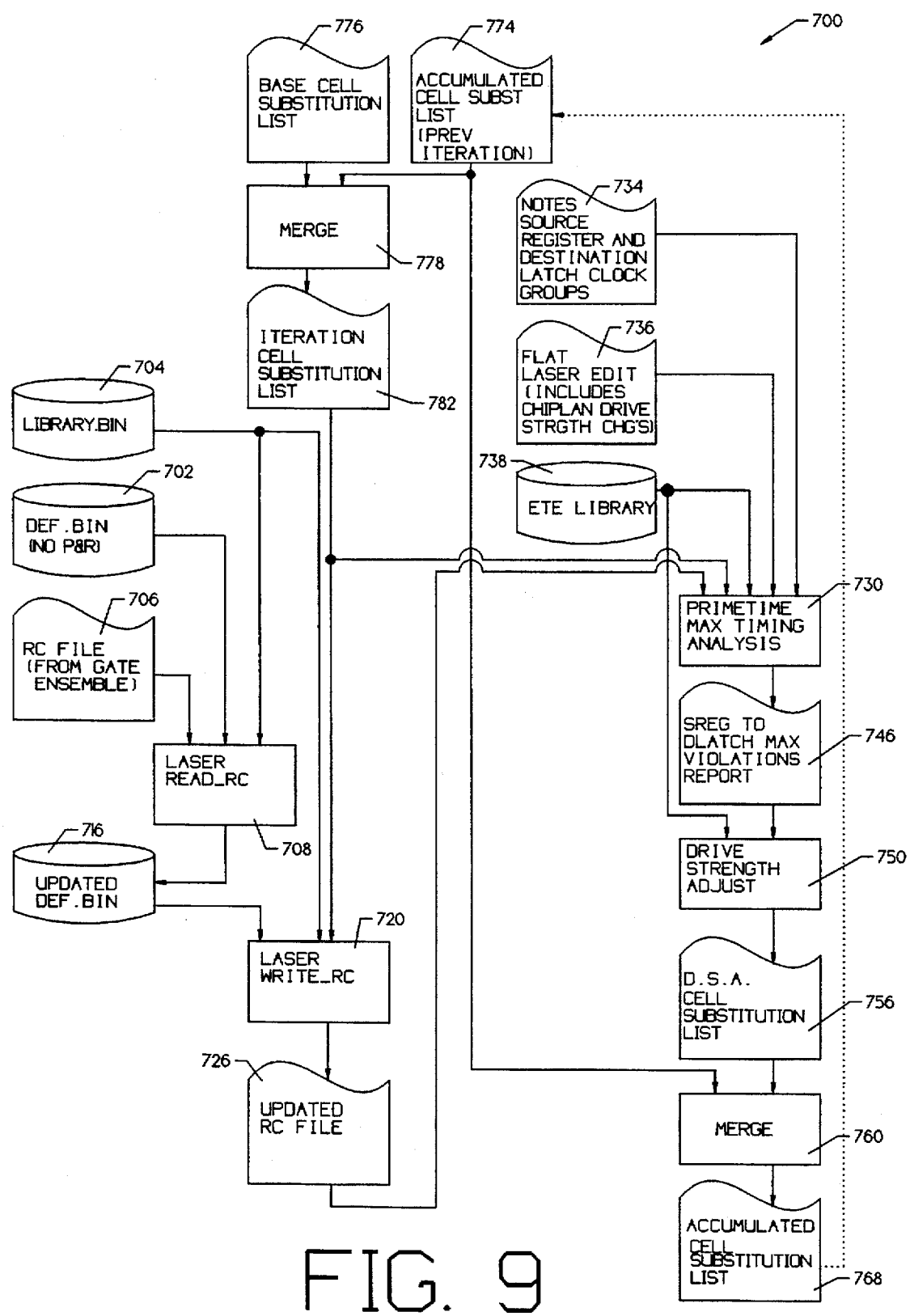
FIG. 9 is a flow diagram showing an fourth illustrative design method utilizing the present invention.

FIG. 9 is a flow diagram showing a fourth illustrative design method utilizing the present invention. The diagram is generally shown at 700. The circuit design database is shown at 702 wherein the designation DEF.BIN refers to a definition file (design database) stored in a data processing system. The design database 702 is the originally entered database, and contains no place and route information.

The design database is placed and routed using a place and route tool known as Gate Ensemble™ available from Cadence Design Systems. An RC file is extracted from the place and route database as shown at 706. Finally, a component library is provided as shown at 704. The component library may include a number of cells wherein each of the cells implements a different function. For example, the component library may include NAND gates, NOR gates, XOR gates, Registers, I/O cells, etc. Further, each of the individual cells may have a logically equivalent component with a different drive strength. Finally, selected cells of the component library may have a number of "representations". For example, a cell may have a "symbolic representation", a "schematic representation", and a "physical representation" as described above.

The design database 702, the component library 704, and the RC file 706 are all provided to a tool called LASER. LASER is a tool developed by the assignee of the present invention to manipulate design database information. For example, the READ-RC module 708 of the LASER program reads the RC file, the design database, and the component library and provides an updated design database as shown at 716. The updated design database contains the RC information for each net within the design database.

The WRITE_RC module 720 of the LASER program reads the updated design database 716, the component library 704, and an iteration cell substitution list 782, and provides an updated RC file 726. During the first design iteration, the iteration cell substitution list 782 is empty.

The updated RC file is provided to a timing analysis tool known as PRIMETIME as shown at 730. PRIMETIME is a timing analysis tool provided by the assignee of the present invention. Besides reading the updated RC file, PRIMETIME may also read the iteration cell substitution list 782, an ETE library 738, Chiplan drive strength changes 736, and a file indicating selected source and destination register clock groups 734. The ETE library 738 is a file containing various characteristics of each cell in the component library 704 for the selected technology. For example, the ETE library 738 may include the delay information for each cell in the component library 704.

PRIMETIME 730 determines the timing of predetermined circuit paths within the design. In a preferred mode, PRIMETIME 730 determined the timing of the paths within and between each of the selected source and destination register clock groups 734. PRIMETIME 730 uses the ETE library 738 to determine the delay of each component with each timing path. That is, part of the pre-processing performed by PRIMETIME 730 is to read the timing information from the ETE library 738 for each of the cells used in the design. For example, the timing information stored in the ETE library 738 may include parameters such as a base delay, and delay per unit of capacitance. PRIMETIME 730 may use the timing information, along with the RC file to determine the delay for each cell within the design. Thereafter, the timing analysis tool identifies predetermined timing paths within the design, and adds the delay for each of the cells to determine an overall path delay for each timing path.

PRIMETIME 730 may then report all timing paths that have an overall path delay that falls outside of a predetermined timing specification as shown at 746. That is, the timing analysis tool may determine if any timing violations exist, and may store a record of the timing violations.

If PRIMETIME 730 identifies timing violations, the designer must evaluate each timing violation, and provide corrections to the design to overcome such timing violations. To mitigate any timing violations that may exist, a drive strength adjust tool 750 may be provided to identify selected components along selected timing paths to substitute with a corresponding logically equivalent component having a different drive strength. The drive strength adjust tool 750 is further described above with reference to FIGS. 4-5.

In a preferred embodiment, after selected cells have been identified for substitution by the drive strength adjust tool 750, a first merge program 760 merges the accumulated cell substitution list of the previous design iteration 774 with the drive strength adjust cell substitution list 756 recommended by the drive strength adjust tool 750, thereby resulting in an updated accumulation cell substitution list 768.

It is contemplated that the first merging program 760 may resolve any conflict between the accumulated cell substitution list of the previous iteration and the substitution list 756 provided by the drive strength adjust tool 750. An example of when a conflict may arise is when a particular cell is identified in more than one timing path during different design iterations. That is, the accumulated cell substitution list may identify a particular cell within a first timing path and may indicate that the particular cell is to be substituted with a logically equivalent cell having a first drive strength. The drive strength adjust tool 750, and during the current design iteration, may also identify the same cell within a second timing path and may indicate that the particular cell is to be substituted with a logically equivalent cell having a second drive strength. It is contemplated that the first merging program 760 may resolve this and other conflicts. In a preferred embodiment, the conflict is resolved based upon a predetermined priority scheme. Further details of the preferred priority scheme may be found below.

The updated accumulated cell substitution list may then be merged with a base cell substitution list 776 as shown at 778. The base cell substitution list 776 is a master list of all existing cell substitutions, and provides the starting point from which future substitutions are made. The merging program 778 may resolve any conflicts that may exist between the accumulated cell substitution list and the base cell substitution list 776, as described above.

After all conflicts are resolved, the merging program 778 may provide an iteration cell substitution list 782. The iteration cell substitution list 782 may then be provided to the WRITE_RC module 720 of the LASER program and to PRIMETIME 730.

It is contemplated that the process of updating the RC file 728, running PRIMETIME 730, writing a timing violations report 746, executing the drive strength adjust tool 750, creating the drive strength adjust cell substitution list 756, merging the drive strength adjust cell substitution list with the accumulated cell substitution list from the previous iteration 760, providing an updated accumulated cell substitution list 774, merging the updated accumulated cell substitution list with the base cell substitution list 778, and providing an iteration cell substitution list 782 may be repeated until the design meets the desired timing specification, or until a predetermined number of design iterations have been achieved.

Figure 10:
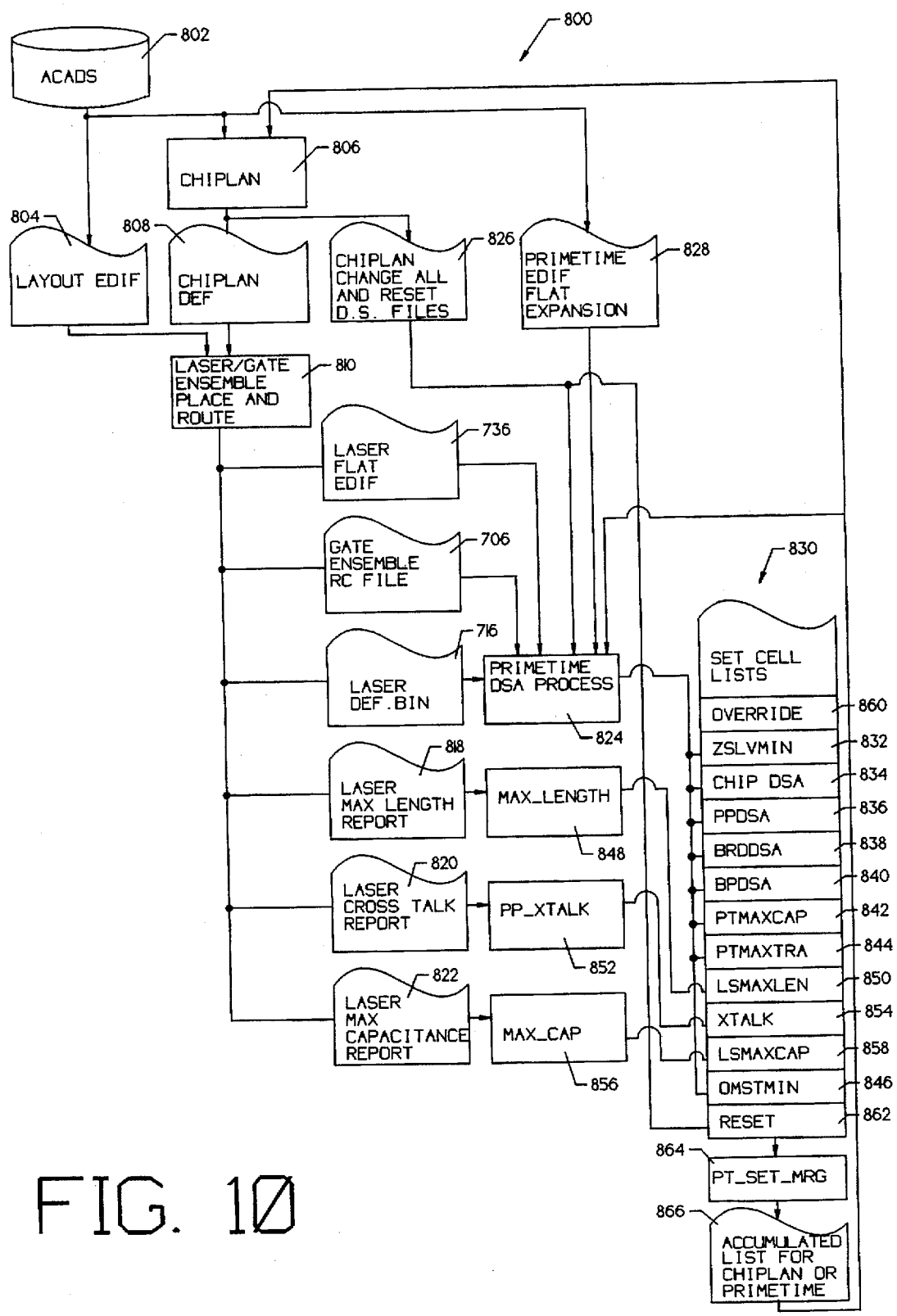
FIG. 10 is a flow diagram showing the generation of a number of cell substitution lists in accordance with an exemplary embodiment of the present invention.

FIG. 10 is a flow diagram showing the generation of a number of cell substitution lists in accordance with an exemplary embodiment of the present invention. The diagram is generally shown at 800, and represents the same basic system as shown in FIG. 9. However, FIG. 10 has been reorganized to more clearly illustrate the operation of the exemplary embodiment of the present invention.

A design database may be stored as shown at 802. The design database may then be processed, or expanded, into an EDIF netlist as shown at 804. The EDIF netlist 804 may be a logical netlist, and may not contain any place and route data. The design database may further be provided to a floor-planning, or manual placement tool. In a preferred embodiment, a manual placement tool called Chiplan may be used, as shown at 806. As indicated above, in some cases it is advantageous to manually place certain critical cells within the design. Often, the critical cells are larger macro-cells such as ALU's RAMs, ROMs, or other macro blocks.

After the critical cells are manually placed by the designer, Chiplan 806 may export a Chiplan definition file 808, identifying the placement and orientation of the manually placed cells. The Chiplan definition file 808 and the expanded EDIF netlist 804 may then be provided to a place and route tool as shown at 810. In a preferred embodiment, a tool called Gate Ensemble, available from Cadence Design Systems, is used as the place and route tool.

The place and route tool may place and route the remaining cells as shown at 810. Thereafter, block 810 may provide a number of functions including passing the expanded EDIF netlist 804 to block 736 as shown (see FIG. 9), providing an RC file to block 706 (see FIG. 9), providing an updated definition file to block 716 (see FIG. 9), and providing a maximum route length report, a maximum cross-talk report, and a maximum capacitance/net report as shown at 818, 820 and 822, respectively.

The timing analysis tool and drive strength adjust process block 824 may receive the updated definition file from block 716, the RC file from block 706, and the expanded EDIF netlist from block 736. As described with reference to FIGS. 4-9, the timing analysis tool and drive strength adjust process block 824 may identify a number of timing violations, and may provide a number of cell substitution recommendations therefor. In the exemplary embodiment, for each type of timing violation, the timing analysis tool and drive strength adjust process block 824 may provide the corresponding cell substitution recommendations to a separate destination, or file.

As shown in FIG. 10, a number of violation types are contemplated. For example, the timing analysis tool and drive strength adjust process block 824 may store all cell substitutions that correspond to zero phase minimum delay time violations in a separate cell substitution file, as shown at 860. Further, all cell substitutions that correspond to chip maximum drive strength timing violations may be stored in a separate cell substitution file, as shown at 834. Finally, the timing analysis tool and drive strength adjust process block 824 may identify board level and backpanel level timing violations, and may provide cell substitutions therefor into separate cell substitution files, as shown at 838 and 840, respectively. A number of other cell substitution files are contemplated, as shown at 836, 842, 844, and 846. Further, it is recognized that these are only exemplary cell substitution files, and that other types of cell substitution files are contemplated.

In addition to the above, a maximum length violation block 848 may read the maximum route length report 818 provide by LASER 810, and determine which cells in the design database to substitute with logically equivalent cells having a different drive strength to mitigate such violations. The maximum length violations block 848 may thus be a drive strength adjust tool, and may provide cell substitution recommendations into a separate cell substitution file 850. Likewise, a maximum cross-talk block 852 may read the maximum cross-talk report 820 provide by LASER 810, and determine which cells in the design database to substitute with logically equivalent cells having a different drive strength to mitigate such violations. The maximum cross-talk block 852 may thus be a drive strength adjust tool, and may provide cell substitution recommendations into a separate cell substitution file 854. Finally, a maximum capacitance block 856 may read the maximum capacitance/net report 822 provide by LASER 810, and determine which cells in the design database to substitute with logically equivalent cells having a different drive strength to mitigate such violations. The maximum capacitance block 856 may thus be a drive strength adjust tool, and may provide cell substitution recommendations into a separate cell substitution file 858.

It is further contemplated that a user definable cell substitution file 860 may be provided. The user definable cell substitution file 860 may be assigned the highest priority, and thus all substitutions identified therein may override all other substitutions. This may give the designer the ability to substitute predetermined cells, and may provide the designer with a certain degree of control over the substitution process.

It is further contemplated that Chiplan 806 may export a listing of the current cells in the design database, as shown at 826. The current listing of cells provides the basis for all database modifications, and may be used to reset the design database after a cell substitution has been made, or after an entire design iteration has been completed. This may be useful when a design iteration has produced a less than optimal solution. It is also contemplated that the design database may be compared against the current listing of cells to ensure that no logic errors have occurred during the substitution process. This is useful in verifying the design database between design iterations.

In this configuration, each of the above separate cell substitution files may contain the cell substitutions that correspond to a particular type of design violation. It is recognized that such a configuration may produce conflicting cell substitutions. For example, a first cell substitution file may recommend substituting a particular component with a logically equivalent component having a first drive strength to mitigate a first type of design violation. A second cell substitution file may recommend substituting the same component with a logically equivalent component having a second drive strength to mitigate a second type of design violation, thereby resulting in a conflicting cell substitution.

The resulting cell substitution files may be provided to a merge and resolve block 864 as shown. The merge and resolve block 864 may assign a priority value to each of the cell substitution files. That is, each type of design violation is assigned a predetermined priority value. In a preferred embodiment, the merge and resolve block 864 may query the user for this information.

After the designer has provided the priority information, the merge and resolve block 864 may resolve all conflicts between the cell substitution files, and may provide a resolved cell substitution list. The resolved cell substitution list may be provided to the accumulated cell substitution list block 866. The accumulated cell substitution list 866 may then be provided back to the timing analysis and drive strength adjust block 824 or to Chiplan 806, as described above.

In a preferred embodiment, the merge and resolve block 864 may resolve conflicting cell substitution by concatenating the number of cell substitution lists, thereby resulting in a concatenated cell substitution list; sorting the concatenated cell substitution list, thereby resulting in a sorted cell substitution list; and deleting duplicate entries from the sorted cell substitution list, except for the highest priority component substitution recommendation.

It is contemplated that the assigning step may further include appending the priority assigned to each of the number of cell substitution lists to each component substitution recommendation included in the corresponding cell substitution list. It is further contemplated that the sorting step may sort the concatenated cell substitution list first by component and then by priority.

FIG. 11 is a table showing the number of cell substitution files of FIG. 10, and the priority assigned thereto. The diagram is generally shown at 900. Column 902 shows the cell substitution files of FIG. 10, and column 906 shows a description of the corresponding design violation types.

As indicated above, each of the cell substitution files contains a number of cell substitution entries that correspond to a particular type of design violation. For example, all cell substitution entries in the LSMXLEN cell substitution file 850 correspond to cell substitutions recommended by maximum length violations block 848 to mitigate maximum length route violations. Similarly, all cell substitution entries in the XTALK cell substitution file 854 correspond to cell substitutions recommended by maximum cross-talk block 852 to mitigate maximum cross-talk violations.

Each of the cell substitution files may be assign a priority value, as shown in column 904. In a preferred embodiment, a low priority value corresponds to a high priority cell substitution. Thus, all substitutions in the override cell substitution file 860, are assigned the highest priority value. It is contemplated that the priority value shown in FIG. 11 are only exemplary, and may be user definable.

Figure 12:
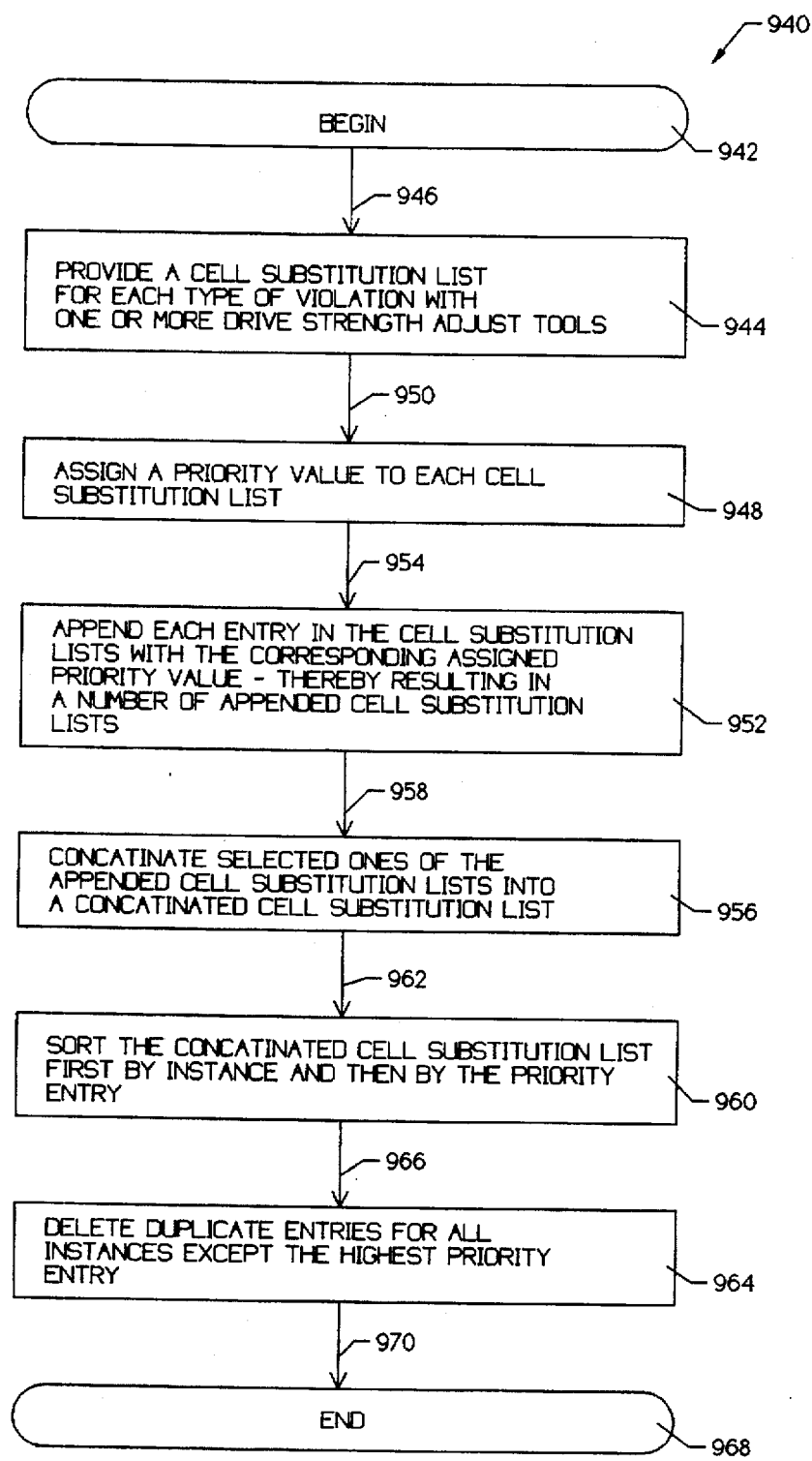
FIG. 12 is a flow diagram showing an exemplary method for resolving conflict between conflicting cell substitution recommendations in accordance with the present invention.

FIG. 12 is a flow diagram showing an exemplary method for resolving conflict between conflicting cell substitution recommendations in accordance with the present invention. The diagram is generally shown at 940. The method is entered at element 942 wherein control is passed to element 944 via interface 946. Element 944 provides a cell substitution list for each type of design violation. Control is then passed to element 948 via interface 950. Element 948 assigns a priority value to each cell substitution list. Control is then passed to element 952 via interface 954. Element 952 appends each entry in each of the cell substitution lists with the corresponding assigned priority value, thereby resulting in a number of appended cell substitution list. Control is then passed to element 956 via interface 958. Element 956 concatenates selected ones of the appended cell substitution lists into a concatenated cell substitution list. Control is then passed to element 960 via interface 962. Element 960 sorts the entries in the concatenated cell substitution list, first by instance and then by priority value. Control is then passed to element 964 via interface 966. Element 964 deletes duplicate entries for all instances, except the highest priority entry. The result may be a resolved cell substitution list. Control is then passed to element 968 via interface 970, wherein the method is existed.

Figure 13:
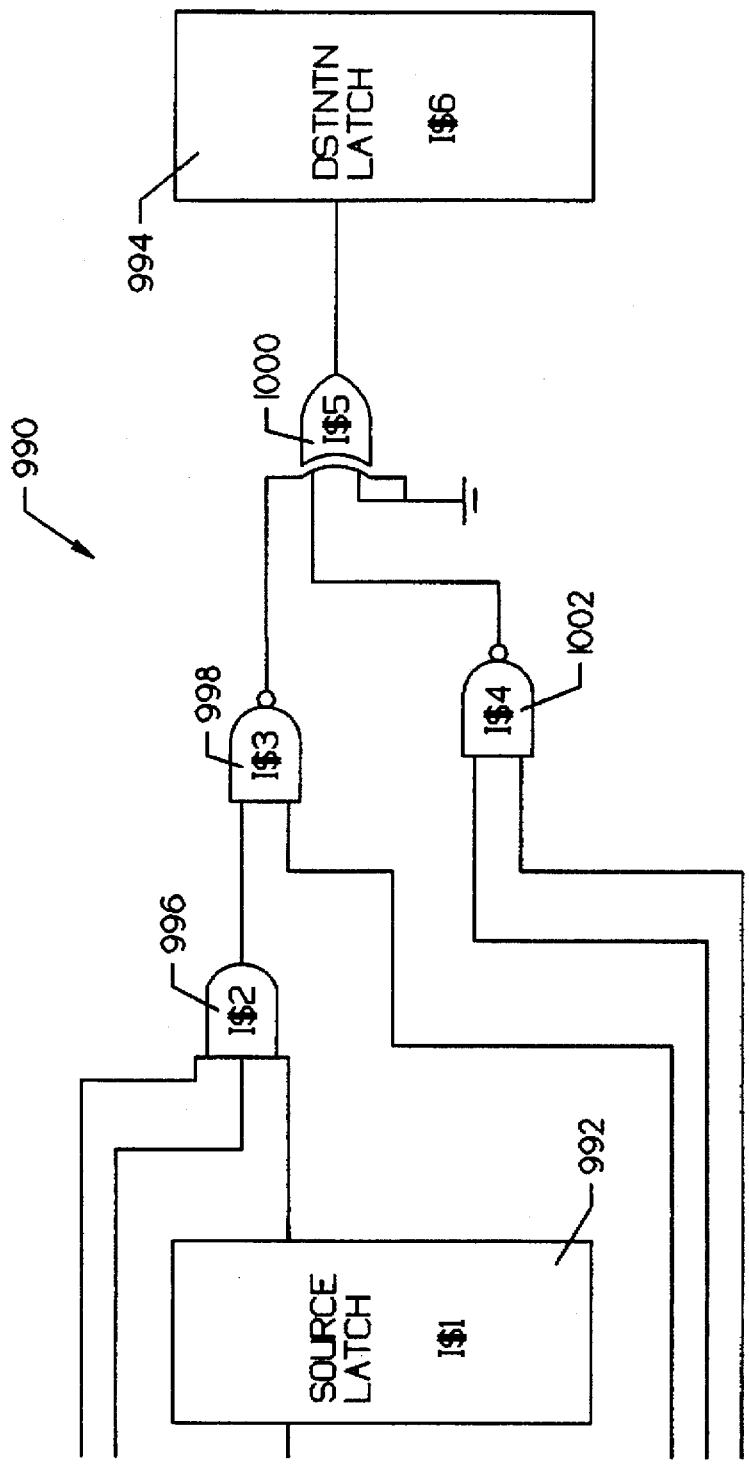
FIG. 13 is a schematic diagram showing an illustrative circuit design having a common cell in two or more timing paths.

FIG. 13 is a schematic diagram showing an illustrative circuit design having a common cell in two or more timing paths. The diagram is generally shown at 990. In the illustrative circuit design, a source latch 992 and a destination latch 994 are provided. The source latch 992 has an instance number of I$1 and the destination latch 994 has an instance number of I$2. Instance numbers are commonly used to uniquely identify each component in the design. The other components also have a corresponding instance number as shown.

A first timing path may extend from source latch 992 through AND gate 996, NAND gate 998, XOR gate 1000, and finally to destination latch 994. Similarly, a second timing path may extend from a source latch (not shown) through NAND gate 1002, XOR gate 1000, and finally to destination latch 994. Thus, XOR gate 1000 resides in both the first and second timing paths.

In the present example, it is readily apparent that one or more drive strength adjust tools may produce a conflict with respect to XOR gate 1000. That is, timing analysis and drive strength adjust process block 824 (see FIG. 10) may conclude that XOR gate 1000 should be substituted with a logically equivalent gate having a first drive strength when analyzing the first timing path, and may conclude that XOR gate 1000 should be substituted with a logically equivalent gate having a second drive strength when analyzing the second timing path.

In addition to the above, maximum cross-talk block 852 may detect a maximum cross talk violation, and may conclude that XOR gate 1000 should be substituted with a logically equivalent gate having a third drive strength. It is recognized that these are only exemplary conflicting cell substitutions, and that others are contemplated.

Figure 14:
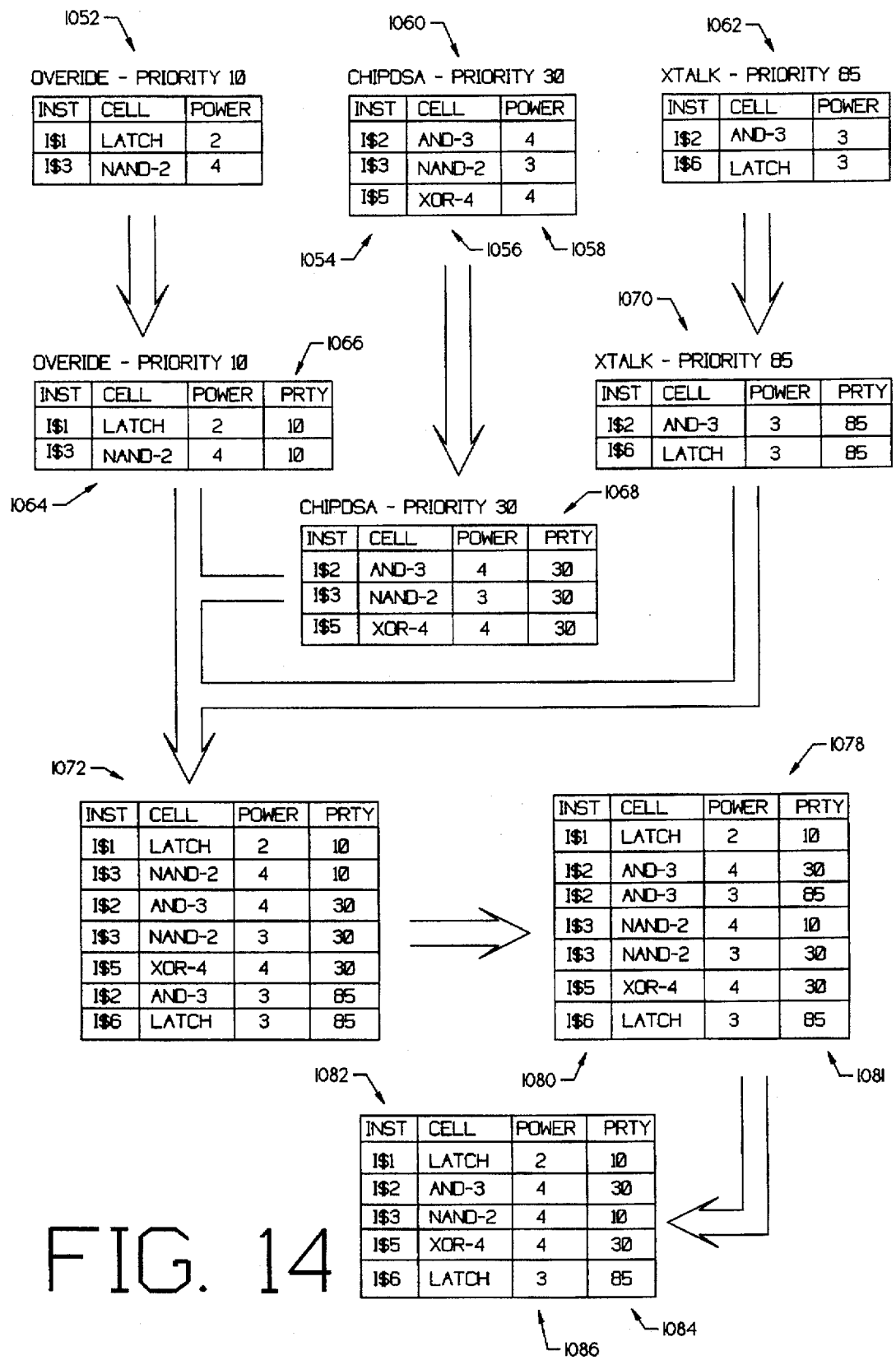
FIG. 14 is a flow diagram showing a preferred method for resolving conflicts between exemplary conflicting cell substitutions for the circuit design of FIG. 13.

FIG. 14 is a flow diagram showing a preferred method for resolving conflicts between exemplary conflicting cell substitutions for the circuit design of FIG. 13. To resolve conflicting cell substitutions, for example as discussed with reference to FIG. 13, the preferred embodiment of the present invention contemplates manipulating the corresponding cell substitution files to arrive at an optimal solution.

In the example shown, an override cell substitution file 1052 may be provided. The override cell substitution file 1052 may include an entry for the source latch I$1 992 and an entry for NAND gate I$3 998 as shown. As indicated above, the override cell substitution file 1052 may be provided directly by the designer, and may have the highest priority assigned thereto (see FIGS. 10-11). Referring to FIG. 11, the override cell substitution file 1052 is assigned a priority value of 10.

Similarly, a CHIPDSA cell substitution file 1060 may be provided. The CHIPDSA cell substitution file 1060 may include an entry for AND gate I$2 996, NAND gate I$3 998 and XOR gate I$5 1000 as shown. As indicated above, a drive strength adjust tool may provide the CHIPDSA cell substitution file 1060, in conjunction with a timing analysis tool. Referring to FIG. 11, the CHIPDSA cell substitution file 1060 is assigned a priority value of 30.

Finally, a XTALK cell substitution file 1062 may be provided by a drive strength adjust tool, and in particular maximum cross talk block 852. The XTALK cell substitution file 1062 may include an entry for AND gate I$2 996 and destination latch I$6 994. As indicated above, the cross talk block 852 (see FIG. 10) may provide the XTALK cell substitution file 1062. Referring to FIG. 11, the XTALK cell substitution file 1062 is assigned a priority value of 85.

In the exemplary embodiment, the merge and resolve block 864 (see FIG. 10) may append the corresponding priority value to each entry of the override, CHIPDSA, and XTALK cell substitution files, as shown at 1064, 1068, and 1070, respectively. Thereafter, the merge and resolve block 864 may concatenate the override, CHIPDSA, and XTALK cell substitution files as shown at 1072. In the table shown at 1072, the first two entries correspond to the override cell substitution file, the following three entries correspond to the CHIPDSA cell substitution file, and the last two entries correspond to the XTALK cell substitution file.

Thereafter, the merge and resolve block 864 may sort the concatenated cell Substitution file 1072, first by instance number, and then by priority. Thus, referring to the sorted cell substitution file 1078, the first entry corresponds to the first instance number I$1. The second and third entries correspond to the second instance number I$2, with the higher priority entry listed first. This is continued for all instances in the concatenated cell substitution file 1078, as shown.

Finally, the merge and resolve block 864 may delete duplicate entries for each instance number, except for the highest priority entry. For example, the second entry for instance number I$2 has been deleted from the sorted cell substitution file, because it has a lower priority value than the first entry for instance number I$2. The resulting file, as shown at 1082, contains a resolved cell substitution list. The resolved cell substitution list 1082 may contain the final cell substitution recommendations for the present design iteration. As indicated above, the resolved cell substitution list 1082 may be provided to the accumulated cell substitution list block 866 (see FIG. 10) for further processing.

Having thus described the preferred embodiments of the present invention, those of skill in the art will readily appreciate that the teachings found herein may be applied to yet other embodiments within the scope of the claims hereto attached.

We claim:

1. A data processing system for resolving conflicts between conflicting component substitution recommendations provided by a drive strength adjust tool, the drive strength adjust tool operating on a circuit design wherein the circuit design is represented in a circuit design database including a number of components selected from a component library, selected components of the component library having at least one corresponding logically equivalent component with a different drive strength, the drive strength adjust tool providing a first recommendation to substitute a first component within the circuit design database with a corresponding logically equivalent component having a first drive strength, and also providing a second recommendation for substituting the first component with a corresponding logically equivalent component having a second drive strength thereby resulting in a conflict, the data processing system comprising:

a. resolving means for resolving the conflict; and
b. providing means coupled to said resolving means for providing a resolved component substitution recommendation.

2. A data processing system according to claim 1 further comprising substituting means coupled to said providing means for substituting the first component in accordance with the resolved component substitution recommendation.

3. A data processing system according to claim 1 wherein said drive strength adjust tool provides a first recommendation type that is associated with the first recommendation, and a second recommendation type that is associated with the second recommendation.

4. A data processing system according to claim 3 wherein said drive strength adjust tool assigns a first priority to the first recommendation type and a second priority to the second recommendation type.

5. A data processing system according to claim 4 wherein said resolving means resolves the conflict by selecting the recommendation having an associated recommendation type with the highest priority.

6. A data processing system according to claim 4 wherein all recommendations of the first recommendation type are stored to a first substitution file within the data processing system, and all recommendations of the second recommendation type are stored to a second substitution file within the data processing system.

7. A data processing system according to claim 6 wherein said resolving means includes merging means for merging the first substitution file with the second substitution file, and for providing a resulting accumulated cell substitution file.

8. A data processing system according to claim 7 wherein said merging means merges the first substitution file with the second substitution file, and only provides the recommendation having the recommendation type with the highest priority to the accumulated cell substitution file.

9. A data processing system according to claim 8 wherein the accumulated cell substitution file is formatted to be read by a circuit floor planning tool.

10. A data processing system according to claim 8 wherein the accumulated cell substitution file is formatted to be read by a circuit place and route tool.

11. A data processing system according to claim 8 wherein the accumulated cell substitution file is formatted to be read by a timing analysis tool.

12. A data processing system according to claim 8 wherein the accumulated cell substitution file is formatted to be read by an RC file generator tool.

13. A data processing system according to claim 6 wherein the first substitution file includes a number of entries corresponding to selected components in the circuit design database wherein each entry is a recommendation of the first recommendation type, and the second substitution file includes a number of entries corresponding to selected components in the circuit design database wherein each entry is a recommendation of the second recommendation type.

14. A data processing system according to claim 13 further including appending means for appending a first priority value to each of the number of entries in the first substitution file thereby resulting in a first appended substitution file, and for appending a second priority value to each of the number of entries in the second substitution file thereby resulting in a second appended substitution file.

15. A data processing system according to claim 14 further comprising concatenating means coupled to said appending means for concatenating the first appended substitution file and the second appended substitution file, thereby resulting in a concatenated substitution file having a number of entries.

16. A data processing system according to claim 15 further comprising sorting means coupled to said concatenating means for sorting the number of entries in the concatenated substitution file, said sorting means sorting the number of entries first by component and then by priority and providing a sorted substitution file.

17. A data processing system according to claim 16 further comprising deleting means coupled to said sorting means for deleting duplicate entries that correspond to the same component from the sorted substitution file, except the highest priority entry.

18. A data processing system according to claim 3 wherein a first drive strength adjust tool provides the first recommendation having the first recommendation type and a second drive strength adjust tool provides the second recommendation having the second recommendation type.

19. A data processing system according to claim 18 wherein said second drive strength adjust tool detects a timing violation within the circuit design database and provides the second recommendation to substitute the first component with the corresponding logically equivalent component having the second drive strength to mitigate the timing violation.

20. A data processing system according to claim 19 wherein said timing violation is a setup violation.

21. A data processing system according to claim 19 wherein said timing violation is a hold violation.

22. A data processing system according to claim 19 wherein said timing violation is a minimum rise time violation.

23. A data processing system according to claim 19 wherein said timing violation is a minimum fall time violation.

24. A data processing system according to claim 18 wherein said first drive strength adjust tool detects a physical violation within the circuit design database and provides the first recommendation to substitute the first component with the corresponding logically equivalent component having the first drive strength to mitigate the physical violation.

25. A data processing system according to claim 24 wherein said physical violation is a maximum line length violation.

26. A data processing system according to claim 24 wherein said physical violation is a maximum cross-talk violation.

27. A data processing system according to claim 24 wherein said physical violation is a maximum capacitance violation.

28. A method for resolving conflicts between conflicting component substitution recommendations provided by a drive strength adjust tool, the drive strength adjust tool operating on a circuit design wherein the circuit design is represented in a circuit design database including a number of components selected from a component library, selected components of the component library having at least one corresponding logically equivalent component with a different drive strength, the drive strength adjust tool providing a first recommendation to substitute a first component within the circuit design database with a corresponding logically equivalent component having a first drive strength, and also providing a second recommendation for substituting the first component with a corresponding logically equivalent component having a second drive strength thereby resulting in a conflict, the method comprising the steps of:

a. resolving the conflict within a data processing system; and b. providing a resolved component substitution recommendation to a storage element within the data processing system.

29. A method according to claim 28 further comprising the step of substituting the first component in accordance with the resolved component substitution recommendation.

30. A method according to claim 28 wherein said drive strength adjust tool provides a first recommendation type that is associated with the first recommendation, and a second recommendation type that is associated with the second recommendation.

31. A method according to claim 30 wherein said drive strength adjust tool assigns a first priority to the first recommendation type and a second priority to the second recommendation type.

32. A method according to claim 31 wherein said resolving step resolves the conflict by selecting the recommendation having an associated recommendation type with the highest priority.

33. A method according to claim 31 wherein all recommendations of the first recommendation type are stored to a first substitution file within the data processing system, and all recommendations of the second recommendation type are stored to a second substitution file within the data processing system.

34. A method according to claim 33 wherein said resolving step further includes a merging step for merging the first substitution file with the second substitution file, and for providing a resulting accumulated cell substitution file.

35. A method according to claim 34 wherein said merging step merges the first substitution file with the second substitution file, and only providing the recommendation having the recommendation type with the highest priority to the accumulated cell substitution file.

36. A method according to claim 34 wherein the accumulated cell substitution file is formatted to be read by a circuit floor planning tool.

37. A method according to claim 34 wherein the accumulated cell substitution file is formatted to be read by a circuit place and route tool.

38. A method according to claim 34 wherein the accumulated cell substitution file is formatted to be read by a timing analysis tool.

39. A method according to claim 34 wherein the accumulated cell substitution file is formatted to be read by an RC file generator tool.

40. A method according to claim 33 wherein the first substitution file includes a number of entries corresponding to selected components in the circuit design database wherein each entry is a recommendation of the first recommendation type, and the second substitution file includes a number of entries corresponding to selected components in the circuit design database wherein each entry is a recommendation of the second recommendation type.

41. A method according to claim 40 further including an appending step for appending a first priority value to each of the number of entries in the first substitution file thereby resulting in a first appended substitution file, and for appending a second priority value to each of the number of entries in the second substitution file thereby resulting in a second appended substitution file.

42. A method according to claim 41 further comprising a concatenating step for concatenating the first appended substitution file and the second appended substitution file, thereby resulting in a concatenated substitution file having a number of entries.

43. A method according to claim 42 further comprising a sorting step for sorting the number of entries in the concatenated substitution file, said sorting means sorting the number of entries first by component and then by priority and providing a sorted substitution file.

44. A method according to claim 43 further comprising a deleting step for deleting duplicate entries that correspond to the same component from the sorted substitution file, except the highest priority entry.

45. A method according to claim 30 wherein a first drive strength adjust tool provides the first recommendation having the first recommendation type and a second drive strength adjust tool provides the second recommendation having the second recommendation type.

46. A method according to claim 45 wherein said second drive strength adjust tool detects a timing violation within the circuit design database and provides the second recommendation to substitute the first component with the corresponding logically equivalent component having the second drive strength to mitigate the timing violation.

47. A method according to claim 46 wherein said timing violation is a setup violation.

48. A method according to claim 46 wherein said timing violation is a hold violation.

49. A method according to claim 46 wherein said timing violation is a minimum rise time violation.

50. A method according to claim 46 wherein said timing violation is a minimum fall time violation.

51. A method according to claim 45 wherein said first drive strength adjust tool detects a physical violation within the circuit design database and provides the first recommendation to substitute the first component with the corresponding logically equivalent component having the first drive strength to mitigate the physical violation.

52. A method according to claim 51 wherein said physical violation is a maximum line length violation.

53. A method according to claim 51 wherein said physical violation is a maximum cross-talk violation.

54. A method according to claim 51 wherein said physical violation is a maximum capacitance violation.

55. A method for resolving conflicts between conflicting component substitution recommendations provided by a drive strength adjust tool, the drive strength adjust tool providing a number of component substitution recommendations for selected components in a circuit design database in response to a number of violations reported by a verification tool, wherein each of the number violations has a corresponding violation type, the method comprising the steps of:

a. incorporating the number of component substitution recommendations into a number of cell substitution lists wherein each of the number of cell substitution lists include all component substitution recommendations that correspond to a particular violation type;

b. assigning a priority to each of the number of cell substitution lists;

c. concatenating the number of cell substitution lists, thereby resulting in a concatenated cell substitution list;

d. sorting the concatenated cell substitution list, thereby resulting in a sorted cell substitution list; and e. deleting duplicate entries from the sorted cell substitution list, except for the highest priority component substitution recommendation.

56. A method according to claim 55 wherein the assigning step further comprising the step of appending the priority assigned to each of the number of cell substitution lists to each component substitution recommendation included in the corresponding cell substitution list.

57. A method according to claim 56 wherein said sorting step sorts the concatenated cell substitution list first by component and then by priority.

* * * * *